United States Patent
Landman et al.

(10) Patent No.: US 9,563,332 B2
(45) Date of Patent: Feb. 7, 2017

(54) CONTEXT-SENSITIVE DISPLAY BAR

(71) Applicant: ACD Systems International Inc., Victoria (CA)

(72) Inventors: Philip Landman, Davie, FL (US); Joaquin De Soto, Coral Gables, FL (US)

(73) Assignee: ACD Systems International Inc., Victoria, British Columbia (CA)

( * ) Notice: Subject to any disclaimer, the term of this patent is extended or adjusted under 35 U.S.C. 154(b) by 586 days.

(21) Appl. No.: 14/042,152

(22) Filed: Sep. 30, 2013

(65) Prior Publication Data
US 2014/0033112 A1 Jan. 30, 2014

Related U.S. Application Data

(62) Division of application No. 12/966,982, filed on Dec. 13, 2010, now Pat. No. 8,615,718, which is a division
(Continued)

(51) Int. Cl.
*G06F 3/0482* (2013.01)
*G06F 3/0485* (2013.01)
(Continued)

(52) U.S. Cl.
CPC ............. *G06F 3/0482* (2013.01); *G06F 3/048* (2013.01); *G06F 3/0481* (2013.01);
(Continued)

(58) Field of Classification Search
CPC .... G06F 17/50; G06F 3/0484; G06F 3/04842; G06F 3/0482; G06F 3/0483; G06F 3/0485; G06F 3/04847; G06F 3/0481; G06F 3/048; G06T 11/00; G06T 11/20
See application file for complete search history.

(56) References Cited

U.S. PATENT DOCUMENTS 4,686,522 A * 8/1987 Hernandez ............ G06F 3/0481
345/160
4,815,029 A * 3/1989 Barker ................ G06F 3/04842
700/83
(Continued)

OTHER PUBLICATIONS

Simonis Volker, Scrolling on demand—A scrollable toolbar component, May 8, 2004.*
(Continued)

*Primary Examiner* — Nicholas Ulrich
(74) *Attorney, Agent, or Firm* — Blakely, Sokoloff, Taylor & Zafman LLP

(57) ABSTRACT

A method for managing a context-dependent display bar, including identifying a graphical object currently displayed by a graphics software application operated by a user, identifying a current edit mode in which the user is working, wherein the edit mode indicates whether or not the user has selected the identified graphical object for editing, identifying a tool for editing graphical objects currently activated by the user, determining a current context in which the user is working, the context depending upon the identified graphical object, the identified edit mode, and the identified tool, identifying at least one control associated with the current context, wherein different contexts generally have at least one different control associated therewith, and displaying the at least one control associated with the current context within a display bar of the graphics software application, each time that the current context changes.

9 Claims, 35 Drawing Sheets

Related U.S. Application Data of application No. 10/881,650, filed on Jun. 29, 2004, now Pat. No. 8,046,712.

(51) Int. Cl.

| | |
|---|---|
| *G06F 3/0483* | (2013.01) |
| *G06F 3/0484* | (2013.01) |
| *G06F 3/0481* | (2013.01) |
| *G06F 3/048* | (2013.01) |
| *G06T 11/20* | (2006.01) |
| *G06F 17/50* | (2006.01) |

(52) U.S. Cl.
CPC .......... *G06F 3/0483* (2013.01); *G06F 3/0485* (2013.01); *G06F 3/04847* (2013.01); *G06F 17/50* (2013.01); *G06T 11/20* (2013.01)

(56) References Cited

U.S. PATENT DOCUMENTS

| | | | |
|---|---|---|---|
| 4,931,783 A | 6/1990 | Atkinson | |
| 5,305,435 A | 4/1994 | Bronson | |
| 5,544,300 A | 8/1996 | Skarbo et al. | |
| 5,598,522 A * | 1/1997 | Inatomi | G06F 3/04895 715/821 |
| 5,734,380 A | 3/1998 | Adams et al. | |
| 5,801,699 A | 9/1998 | Hocker et al. | |
| 5,808,610 A | 9/1998 | Benson et al. | |
| 5,912,666 A * | 6/1999 | Watson | G06F 3/0481 708/303 |
| 5,917,492 A | 6/1999 | Bereiter et al. | |
| 5,977,973 A | 11/1999 | Sobeski et al. | |
| 6,049,335 A * | 4/2000 | Iida | G06F 3/0482 715/811 |
| 6,166,736 A | 12/2000 | Hugh | |
| 6,232,972 B1 * | 5/2001 | Arcuri | G06F 3/0482 715/815 |
| 6,313,854 B1 | 11/2001 | Gibson | |
| 6,337,703 B1 | 1/2002 | Konar et al. | |
| 6,493,006 B1 * | 12/2002 | Gourdol | G06F 3/0482 715/810 |
| 6,624,831 B1 * | 9/2003 | Shahine | G06F 3/0482 715/811 |
| 6,715,127 B1 * | 3/2004 | Eschbach | G06T 11/60 715/202 |
| 6,765,592 B1 | 7/2004 | Pletcher et al. | |
| 6,825,859 B1 * | 11/2004 | Severenuk | H04L 69/329 715/762 |
| 6,853,390 B1 | 2/2005 | Wandersleben et al. | |
| 6,857,105 B1 * | 2/2005 | Fox | G06F 3/0482 715/808 |
| 6,970,749 B1 | 11/2005 | Chinn et al. | |
| 6,981,223 B2 | 12/2005 | Becker et al. | |
| 7,017,123 B2 | 3/2006 | Chickles et al. | |
| 7,058,902 B2 * | 6/2006 | Iwema | G06F 3/0488 345/156 |
| 7,290,219 B2 * | 10/2007 | Boyles | G06F 3/04842 715/212 |
| 2002/0149623 A1 * | 10/2002 | West | G06F 9/4443 715/765 |
| 2004/0113948 A1 | 6/2004 | Shahrbabaki et al. | |
| 2005/0125742 A1 | 6/2005 | Grotjohn et al. | |
| 2007/0192725 A1 * | 8/2007 | Chen | G06F 9/4443 715/779 |

OTHER PUBLICATIONS

Adobe Photoshop Elements 2.0, printed from web by examiner Jun. 24, 2008, versiontracker.com.
Apple Computer, Inc, "Inside Mac OS X: Handling Carbon Windows and Controls", XP-002536251, Sep. 2002, pp. 1-13 and 101-105.
David Rosenthal, et al., "Inter-Client Communication Conventions Manual—Section 4: Client to Window Manager Communication", XP-002536252, Sep. 2002, pp. 1-6 and 1-27.
EP Communication enclosing the European Search Report for EP Application No. 05254080.4-1243, Feb. 1, 2010, 6 pages.
EP Communication enclosing the partial European Search Report for EP Application No. 05254080.4-1243, Jul. 29, 2009, 5 pages.
Eser Kandogan, et al., "Elastic Windows: Evaluation of Multi-Window Operations", XP-002536250, Proceedings of the SIGCHI Conference on Human Factors in Computing Systems, Mar. 22-27, 1997, pp. 250-257.
Hoeschen et al., Photoshop Elements 2 for Windows and Macintosh: Visual Quickstart Guide, Oct. 18, 2002, Peachpit Press.
Ken Stone, Adobe Photoshop Elements 2.0, Oct. 7, 2002, kenstone.net, pp. 1-3.
Lori Grunin, Adobe Photoshop Elements 2.0 at a Glance, Mar. 3, 2003, reviews.cnet.com.
Microsoft, "The Windows Interface Guidelines for Software Design—Chapter 11: Working with OLE Embedded and OLE Linked Objects", XP-002561843, May 1995, pp. 277-337.
Microsoft, "Welcome to the Windows XP Visual Guidelines", XP-002561842, Mar. 5, 2002, 49 pages.
WINAMP v 2.80, Apr. 23, 2002, NullSoft, screenshots created by examiner on Jan. 5, 2010, WINAMP v2.80 available for download at www.oldapps.com/winamp.php.

\* cited by examiner

CONTEXT-SENSITIVE DISPLAY BAR

This application is a divisional of U.S. patent application Ser. No. 12/966,982 filed on Dec. 13, 2010, which is a divisional of U.S. patent application Ser. No. 10/881,650 filed on Jun. 29, 2004, now issued as U.S. Pat. No. 8,046,712.

FIELD OF THE INVENTION

The present invention relates to management of window panels generated within software applications.

BACKGROUND OF THE INVENTION

Professional software applications generally offer a lot of special features. Graphics applications, for example, operate through objects and layers. Objects typically include vector primitives such as character fonts, points, lines and areas, as well as raster images. Layers include one or more objects, and are composited together in a variety of ways. User actions are applied through tools for curves, rectangles, ellipses, text, brush strokes, color fills, erasers, and much more. Tools may have many controls associated therewith, for setting and adjusting properties such as size, thickness, shape, color and opacity. Objects are generated and modified using palettes.

Users taking advantage of the many features of professional software applications quickly find themselves buried with window panels on the display screen. FIGS. 1A and 1B are two examples of graphic applications, illustrating an abundance of window panels for tools and palettes that are accessible. As can be seen, the window panels confine and clutter a user's working space, and the user spends a lot of time and effort in moving the window panels around.

There is therefore a need for a systematic way to manage multiple window panels for software applications so as to maintain their accessibility, while making it easy for a user to use them to perform tasks within the software applications.

Another drawback of professional software applications is that although a wide variety of controls are available, for each state that the application is in, only a subset of controls is relevant. As states dynamically change, a user often needs help in finding the appropriate subset of controls for a current state.

There is therefore also a need for a systematic way to manage controls, so that an appropriate subset of controls for a current state of the application is always readily available to the user.

SUMMARY OF THE INVENTION

Professional software applications such as graphics programs often provide a variety of features through the use of palettes and toolboxes. Palettes are used to provide alternatives for a specific type of user action. A familiar example of a palette is a color palette, used to provide a user with choices of a color for filling in an area of a graphic, or for a background, or for a border, or for other parts of an object. Another example of a palette is a combine palette, used to provide different alternative ways to combine two objects that overlap one on top of the other. Generally, each palette is displayed within its own window panel of an application program, and professional applications may provide so many different palettes, that management of the window panels can become complicated and difficult.

Toolboxes are used to provide many tools for use within an application, such as a tool for brush strokes, a tool for generating curves, a tool for generating rectangles, a tool for generating circles, a tool for erasers and a tool for text. In turn, some of the tools within a toolbox may themselves use a variety of specific sub-tools. Similar to window panels for palettes, window panels for toolboxes can also become complicated and difficult to manage.

The present invention provides a method and system for conveniently managing proliferation of rectangular window panels within software applications. In accordance with a preferred embodiment of the present invention, window panels can be fastened, or snapped, together into a cohesive union that can be moved about as a single area; namely, an area that is a union of rectangles. When one panel is brought into close proximity of another panel, the two panels snap together to form a single combined area, referred to herein as a "union". Unions of two or more panels can be generated by combining individual panels, and by combining unions of panels into larger unions.

The present invention also provides a way of breaking a union of panels apart into smaller unions. When a panel that is part of a union of panels is moved while the shift key is depressed, that panel is separated from the others and it alone moves while the other panels remain fixed. Similarly, when a panel that is part of a union of panels is moved while the control key is depressed, that panel and all other panels of the union that are positioned below and to the right of it are separated from the others, and they alone move while the other panels remain fixed. Thus by using the shift and control keys a user can easily decompose a union of panels into two or more smaller unions, as desired.

The snapping together of window panels provides a user with important advantages: (i) it is easier to move multiple window panels in unison as a single area, rather than individually; and (ii) window panels that are not fastened together either overlap and obscure one another, making it difficult to access them, or else spread out and obscure the document being worked on by the user, making it difficult to access the document.

The present invention provides a method and system for managing toolbox panels, referred to as "parent" panels, for tools which themselves require panels of sub-tools, referred to as "child" panels. For example, a transparency tool within a parent window panel may invoke sub-tools in a child panel for different transparency effects, such as radial transparency, directional transparency, rectangular transparency, elliptical transparency and a ghost tool for generating masks for an alpha channel using brush strokes. In accordance with a preferred embodiment, the present invention positions a child window panel adjacent to its parent window panel when the child panel is first generated, and fastens the parent and child panels together so that they behave cohesively as a single area. Moreover, the child panel is automatically closed when the parent panel closes. If a user desires to circumvent this feature, the child panel can be locked, so as to remain open after its parent panel closes. The present invention also manages multiple child panels, which are stacked adjacent to one another.

The present invention also provides a method and system for managing controls within a display bar when the size of the display bar cannot accommodate all of the controls. In accordance with a preferred embodiment of the present invention, the display bar is arranged in successive portions that can be interactively accessed through page forward and page backward buttons. Each portion of the display bar displays a subset of the controls, so that controls hidden on one portion of the display bar are visible on another portion, thus making it easy and convenient for a user to access any of the controls by navigating forward and backward.

The present invention also provides a method and system for managing a context-dependent display bar, based on a context in which a user is processing a graphical object within a graphics software application. The context is determined from an object, an edit mode and a tool activated by the user. Controls associated with a current context are displayed dynamically within a display bar. When a user selects a tool or an object, or enters an edit mode, the display bar changes accordingly, to include controls that are relevant to the current context. The display bar thus includes the subset of controls that are relevant to the current context of the graphics application, ensuring that the controls that a user requires are always readily available. Furthermore, context-sensitive help is linked to the display bar, so that a user can obtain instructions for using the controls within the display bar while working in the current context.

There is thus provided in accordance with a preferred embodiment of the present invention a method for managing a plurality of window panels within a computer software application including generating a window panel that is actively controlled by a user interface of a computer software application, indicating that a plurality of window panels generated by the generating are fastened together as a single union, wherein a union comprises at least one window panel that behave together as a single geometrical area when moved by a user within a computer display screen, the indicating occurring when one of the plurality of window panels is in close proximity to another of the plurality of window panels within the computer display screen, rigidly moving a union of window panels as a single geometrical area within the computer display screen, and detecting that a second union is in close proximity to a first union within the computer display screen.

There is further provided in accordance with a preferred embodiment of the present invention a user interface for managing a plurality of window panels including a window panel generator for generating a window panel that is actively controlled by a user interface of a computer software application, a window concatenator for indicating that a plurality of window panels generated by the window panel generator are fastened together as a single union, a window mover for rigidly moving a union of fastened-together window panels as a single geometrical area within a display screen, and a window position detector for detecting that a second window panel is positioned in close proximity to a first window panel within a display screen.

There is yet further provided in accordance with a preferred embodiment of the present invention a method for managing a plurality of window panels within a computer software application including generating a window panel for a palette that is actively controlled by a user interface of a computer software application, displaying the window panel within a computer display device, detecting that a user is applying an action at a location within the display device, docking the window panel for the palette within a docking bar when the detecting detects that a user is applying a docking action to the window panel, displaying a tab within the docking bar for enabling the palette when the window panel is docked by the docking, displaying the palette within an area connected to the tab, but not within a window panel, when the detecting detects that the user is applying an activation action to the tab, and displaying the palette within a window panel when the detecting detects that the user is applying a generation action to the tab.

There is additionally provided in accordance with a preferred embodiment of the present invention a user interface for managing a plurality of window panels within a computer software application including a window panel generator for generating a window panel for a palette that is actively controlled by a user interface of a computer software application, and for displaying the window panel within a computer display device, a user input detector for detecting that a user is applying an action at a location within the display device, a window docking manager for docking the window panel for the palette within a docking bar of the user interface when the user input detector detects that a user is applying a docking action to the window panel, and a display manager (i) for displaying a tab within the docking bar for enabling the palette when the window docking manager docks the window panel, (ii) for displaying the palette within an area connected to the tab, but not within a window panel, when the user input detector detects that the user is applying an activation action to the tab, and (iii) for displaying the palette within a window panel when the user input detector detects that the user is applying a generation action to the tab.

There is moreover provided in accordance with a preferred embodiment of the present invention a method for managing a plurality of controls within a display bar, including detecting that a user is applying a page forward action to advance a display bar from a current portion to a next portion, determining at least one control from among a plurality of controls that are to be visible when the display bar is advanced to the next portion, and displaying the visible controls within the next portion of the display bar, in response to the detecting.

There is further provided in accordance with a preferred embodiment of the present invention a user interface for managing a plurality of controls within a display bar, including a user input detector for detecting that a user is applying a page forward action to advance a display bar from a current portion to a next portion, a window processor for determining at least one control from among a plurality of controls that are to be visible when the display bar is advanced to the next portion, and a display processor for displaying the visible controls within the next portion of the display bar, in response to the user input detector detecting the page forward action.

There is yet further provided in accordance with a preferred embodiment of the present invention a method for managing a context-dependent display bar, including identifying a graphical object currently selected by a user who is interactively running a graphics software application through a graphical user interface to process an image, wherein the image is a vector image or a raster image or a combination vector and raster image, identifying a current edit mode in which the user is working, identifying a tool currently activated by the user, determining a current context in which the user is working, the context depending upon the identified graphical object, the identified edit mode, and the identified tool, identifying at least one control associated with the current context, displaying the image, and displaying the associated controls for the current context within a display bar of the graphical user interface.

There is additionally provided in accordance with a preferred embodiment of the present invention a user interface for managing a context-dependent display bar, including a context processor including a state identifier for identifying (i) a graphical object being selected by a user who is interactively running a graphics software application to process a image, wherein the image is a vector image or a raster image or a combination vector and raster image, (ii) an edit mode within which the user is working, (iii) a tool activated by the user, and (iv) at least one control associated with a current context in which a user is working, and a context identifier for determining the current context, the current context depending upon the identified graphical object, the identified edit mode, and the identified tool, and a display manager operatively coupled with the context processor for displaying (i) the image, and (ii) a display bar including the associated controls for the current context.

There is moreover provided in accordance with a preferred embodiment of the present invention a computer readable storage medium storing program code for causing a computer to perform the steps of generating a window panel that is actively controlled by a user interface of a computer software application, indicating that a plurality of window panels generated by the generating are fastened together as a single union, wherein a union comprises at least one window panel that behave together as a single geometrical area when moved by a user within a computer display screen, the indicating occurring when one of the plurality of window panels is in close proximity to another of the plurality of window panels within the computer display screen, rigidly moving a union of window panels as a single geometrical area within the computer display screen, and detecting that a second union is in close proximity to a first union within the computer display screen.

There is further provided in accordance with a preferred embodiment of the present invention a computer readable storage medium storing program code for causing a computer to perform the steps of generating a window panel for a palette that is actively controlled by a user interface of a computer software application, displaying the window panel within a computer display device, detecting that a user is applying an action at a location within the display device, docking the window panel for the palette within a docking bar when the detecting detects that a user is applying a docking action to the window panel, displaying a tab within the docking bar for enabling the palette when the window panel is docked by the docking, displaying the palette within an area connected to the tab, but not within a window panel, when the detecting detects that the user is applying an activation action to the tab, and displaying the palette within a window panel when the detecting detects that the user is applying a generation action to the tab.

There is yet further provided in accordance with a preferred embodiment of the present invention a computer readable storage medium storing program code for causing a computer to perform the steps of detecting that a user is applying a page forward action to advance a display bar from a current portion to a next portion, determining at least one control from among a plurality of controls that are to be visible when the display bar is advanced to the next portion, and displaying the visible controls within the next portion of the display bar, in response to the detecting.

There is additionally provided in accordance with a preferred embodiment of the present invention a computer readable storage medium storing program code for causing a computer to perform the steps of identifying a graphical object currently selected by a user who is interactively running a graphics software application through a graphical user interface to process an image, wherein the image is a vector image or a raster image or a combination vector and raster image, identifying a current edit mode in which the user is working, identifying a tool currently activated by the user, determining a current context in which the user is working, the context depending upon the identified graphical object, the identified edit mode, and the identified tool, identifying at least one control associated with the current context, displaying the image, and displaying the associated controls for the current context within a display bar of the graphical user interface.

BRIEF DESCRIPTION OF THE DRAWINGS

The present invention will be more fully understood and appreciated from the following detailed description, taken in conjunction with the drawings in which:

FIGS. 3A-3J are illustrations of fastening window panels together, in accordance with a preferred embodiment of the present invention;

LIST OF APPENDICES

Appendix A is a detailed listing of computer source code written in the C++ programming language for implementing a preferred embodiment for managing window panels that can be fastened together in unions, in accordance with the present invention, and in conjunction with a Microsoft Windows operating system.

Appendix B is a detailed listing of computer source code written in the C++ programming language for implementing a preferred embodiment for managing window panels that can have parent-child relationships, in accordance with the present invention, and in conjunction with a Microsoft Windows operating system.

Appendix C is a detailed listing of computer source code written in the C++ programming language for implementing a preferred embodiment for managing context-sensitive property bars and multi-page property bars, in accordance with the present invention, and in conjunction with a Microsoft Windows operating system

DETAILED DESCRIPTION OF A PREFERRED EMBODIMENT

The present invention provides a method and system for managing multiple window panels within a software application. Using the present invention, a large number of window panels can be made readily accessible as a user works within the software application, without confining the user's workspace and cluttering up a display screen.

The present invention is preferably implemented within a conventional computing device including a central processing unit, memory units for storing programs and data, input devices including a mouse and keyboard, and an output display device. Preferably, the central processing unit, memory units, and device drivers for the mouse, keyboard and display are coupled communicatively together using a conventional data bus. It may be appreciated, however, from the description hereinbelow, that the present invention may also be implemented within non-conventional computing devices, as long as such devices include processing means, program and data storage means, and input and display means that inter-communicate. The present invention can be implemented within a standalone computer, or within one or more networked computers.

Figure 1A:
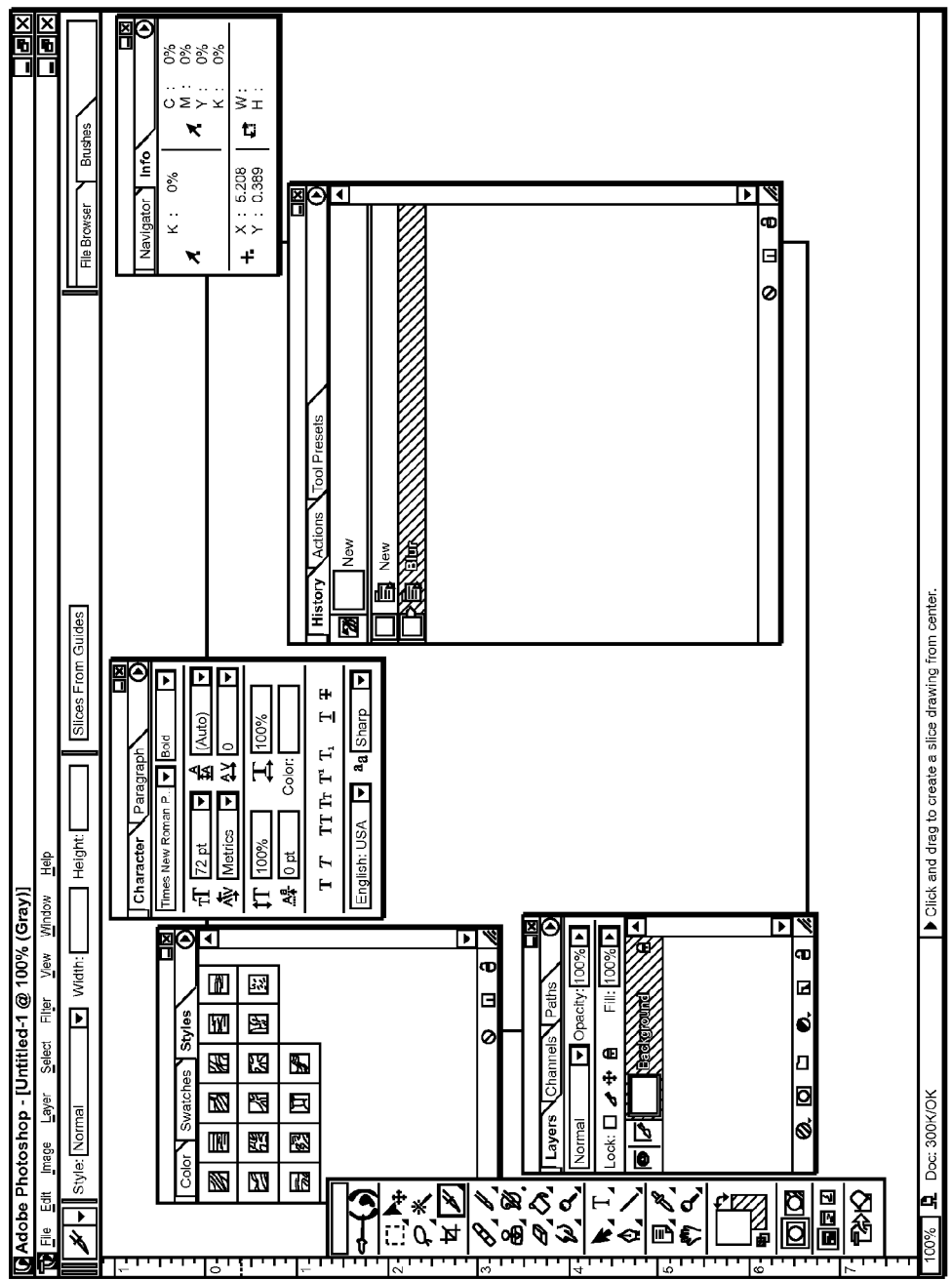
FIGS. 1A and 1B are prior art illustrations of window panels displayed within a graphics software application.
Figure 1B:
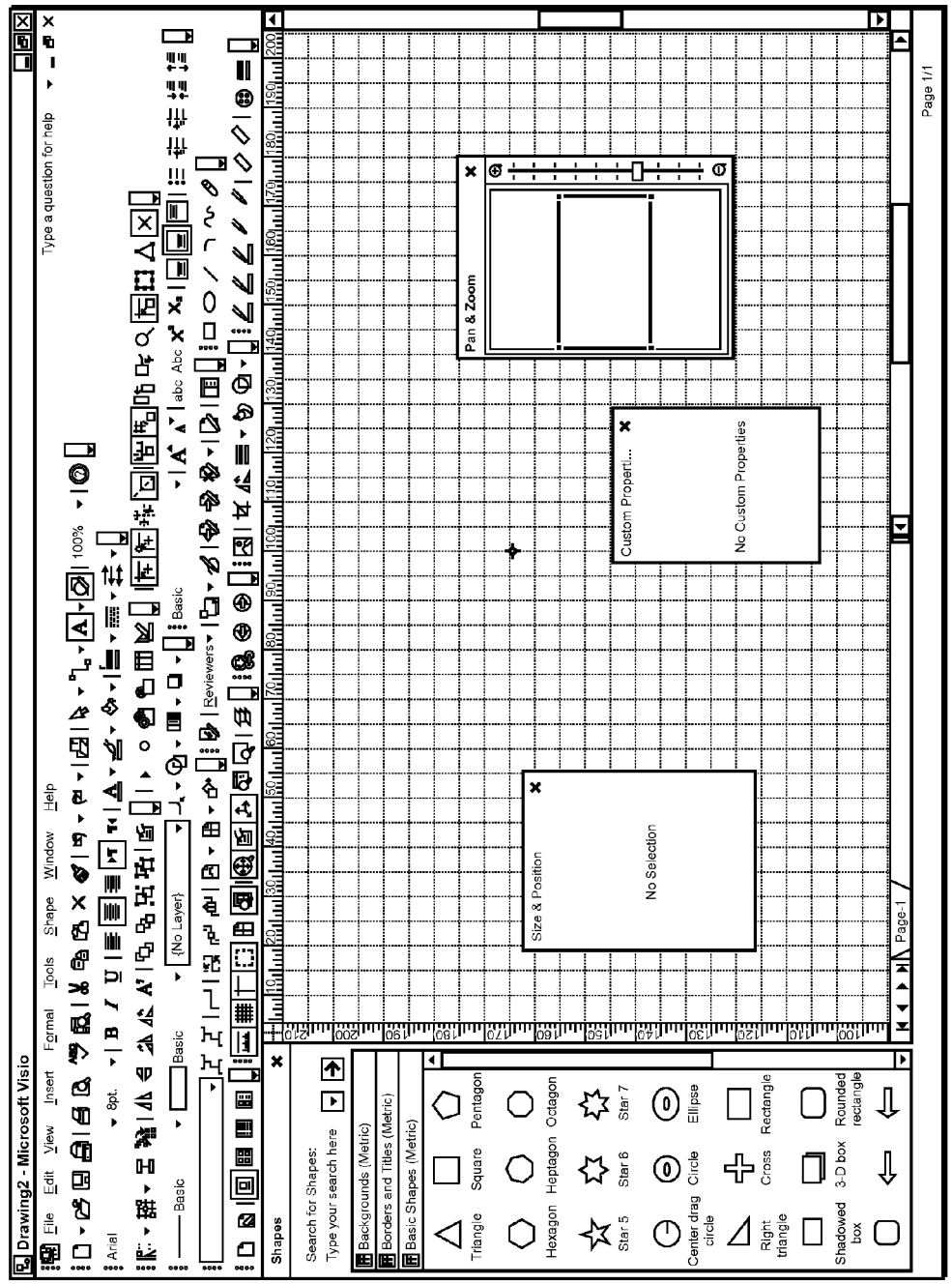
Figure 2A:
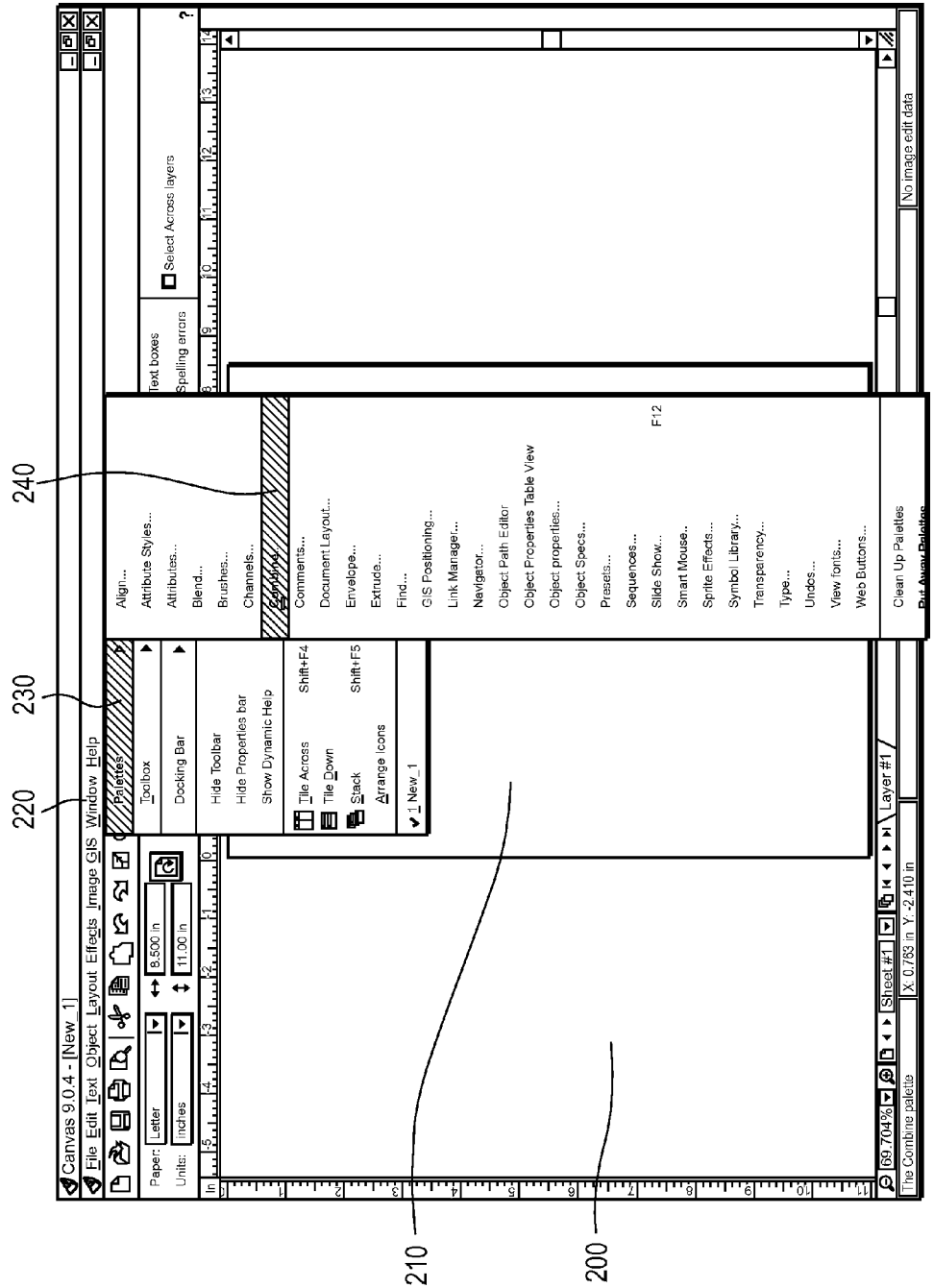
FIGS. 2A-2D are illustrations of docking window panels, in accordance with a preferred embodiment of the present invention.
Figure 2B:
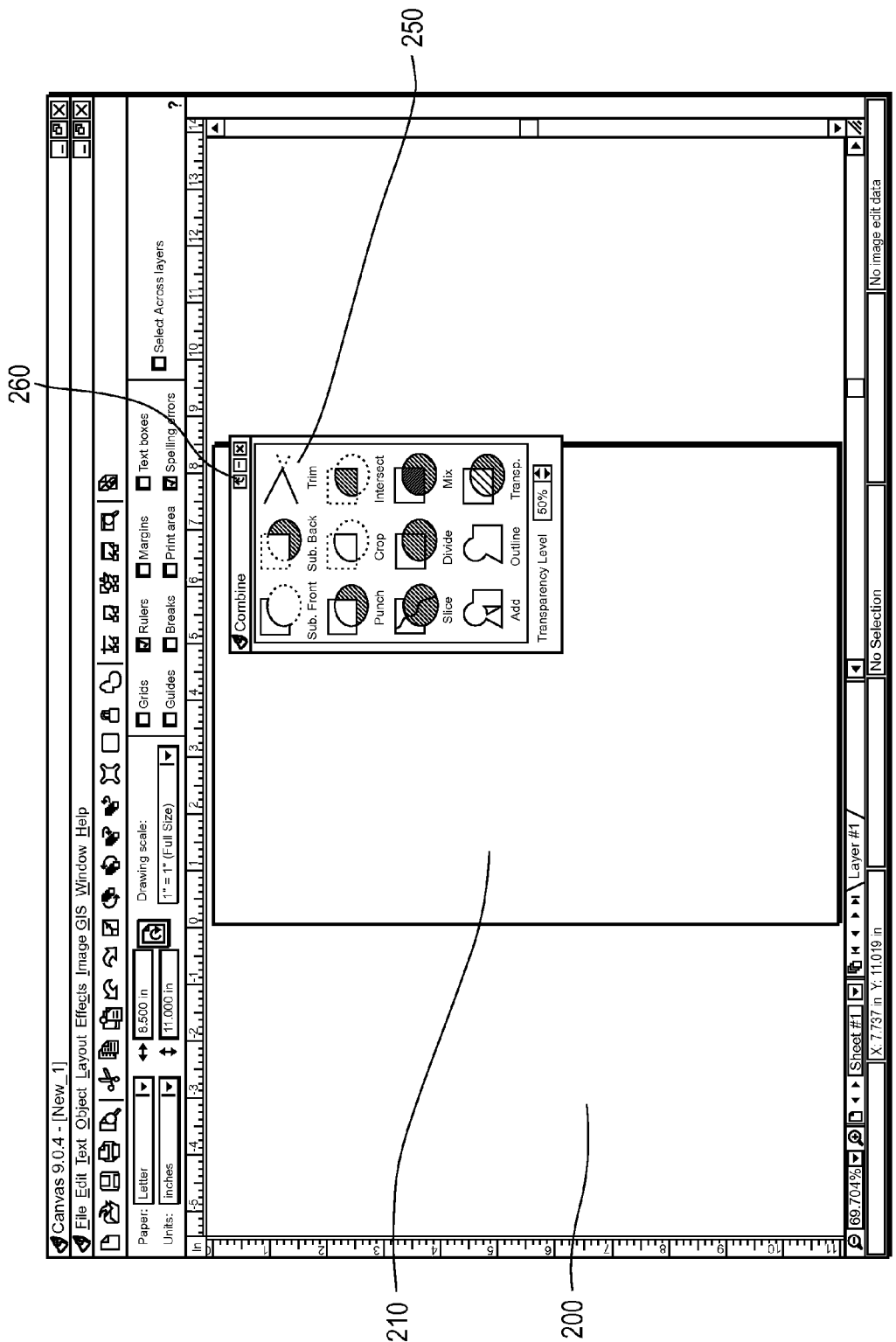
Figure 2C:
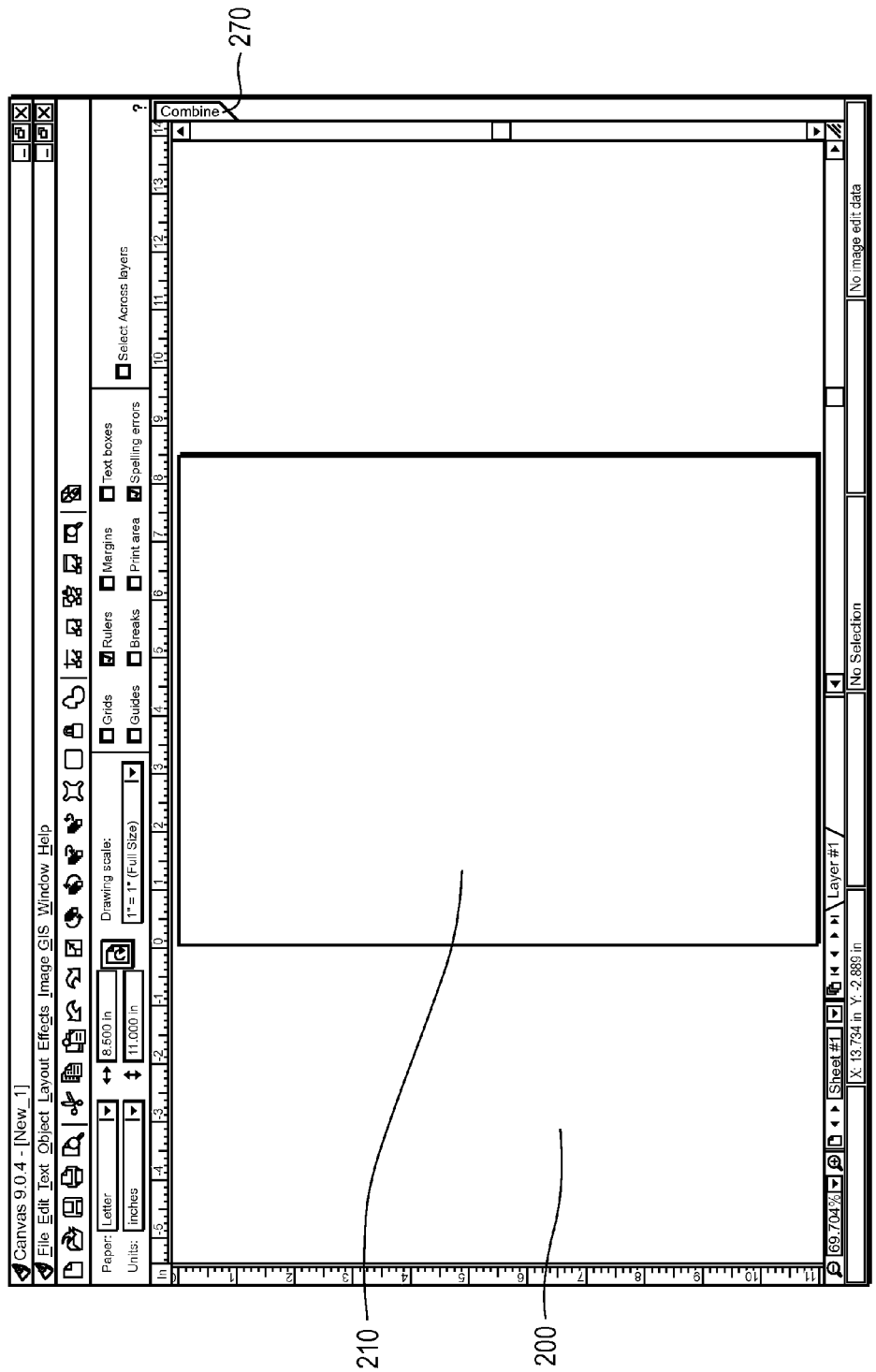

Reference is now made to FIGS. 2A-2C, which are illustrations of docking window panels, in accordance with a preferred embodiment of the present invention. Shown in FIG. 2A is a master window 200 for a software application manufactured and marketed by ACD Systems, Inc. named Canvas™. Canvas is a professional graphics program that provides a wide range of graphics capabilities, generally accessed through tools and palettes.

As shown in FIG. 2A, a user has opened a blank document 210 and selected "Window" 220 in the menu bar. Upon clicking on "Window" 220, a first pop up list is displayed, and the user has selected "Palettes" 230. Upon clicking on "Palettes" a second pop up list is displayed, including a list of many palettes. The user has selected a "Combine" palette 240.

Shown in FIG. 2B is a window panel 250 that includes icons for the combine palette. Each icon represents a different combine operation, for combining two objects. Near the top right corner of window panel 250 is a button 260 for docking the panel.

Figure 2D:
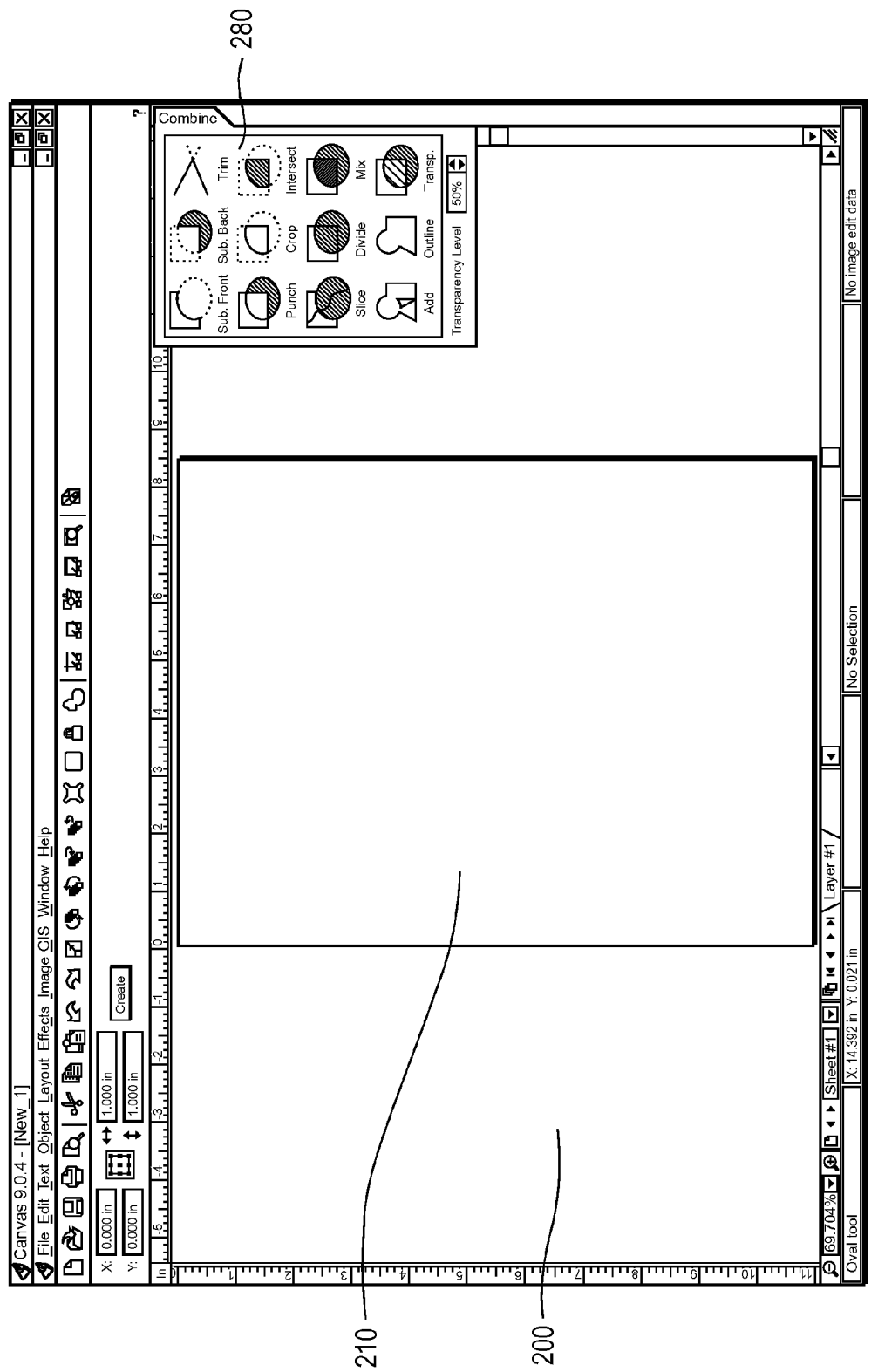

Shown in FIG. 2C is a tab 270 indicating that window panel 250 has been docked. Window panel 250 no longer appears in the Canvas application window, but it can be re-displayed by clicking on tab 270. In a preferred embodiment of the present invention, when a user clicks on tab 270, the combine palette is displayed in an area 280 adjacent and to the left of tab 270, as shown in FIG. 2D. If the user subsequently clicks on tab 270 again, or clicks anywhere outside of the combine palette, the palette is re-docked. If the user clicks on tab 270 and, while a mouse button is depressed, moves the mouse pointer, then window panel 250 is opened at the location where the mouse button is released, as in FIG. 2B.

It often occurs with professional graphics applications that a user opens many palettes while working on graphics and, unless managed properly, the palettes can clutter the application window, making it difficult for the user to work. Docking of palettes is a convenient way to keep the palettes in a ready state, while not cluttering the application window.

Figure 3A:
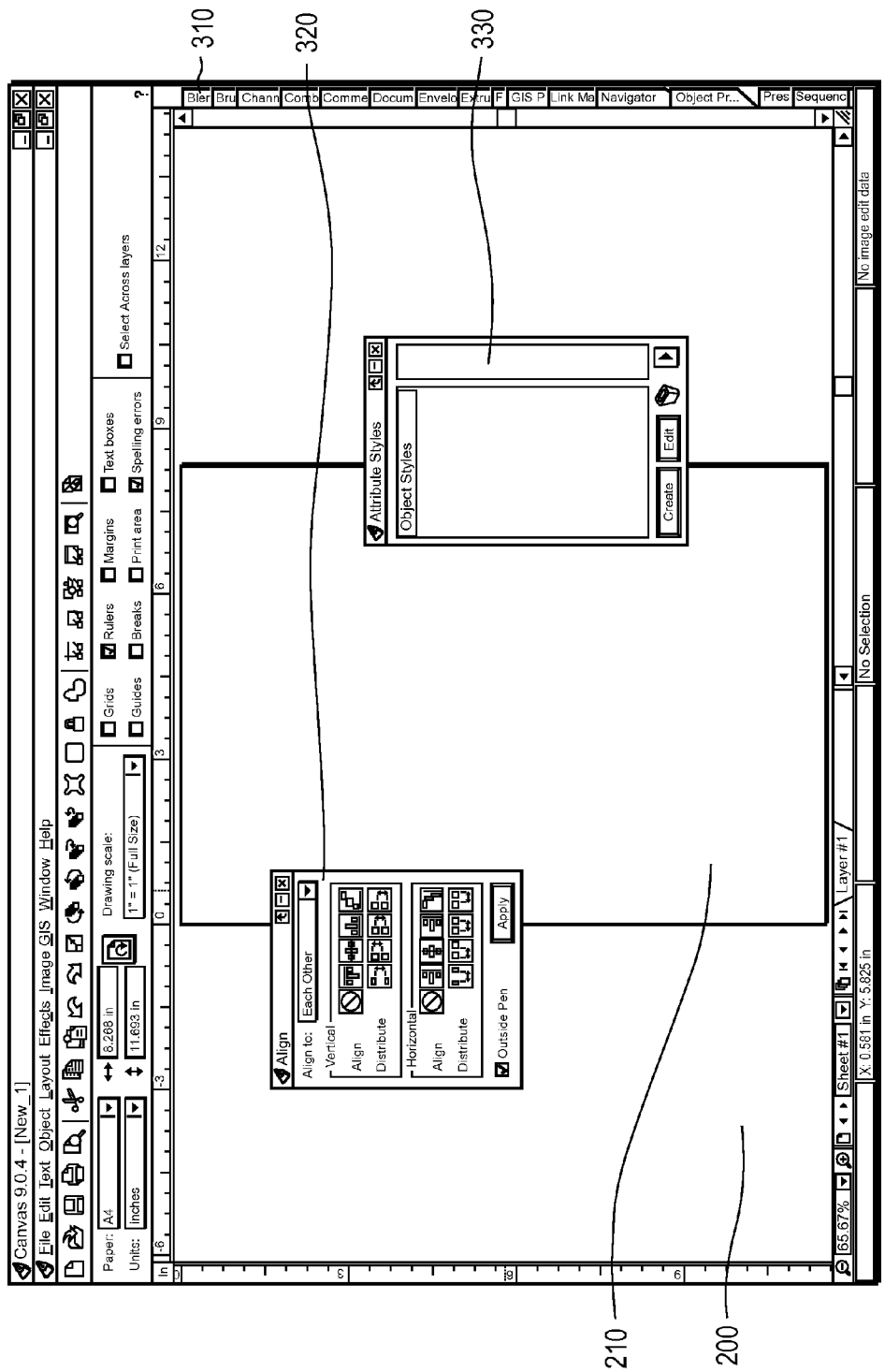

Reference is now made to FIGS. 3A-3J, which are illustrations of fastening window panels together, in accordance with a preferred embodiment of the present invention. Shown in FIG. 3A are docked palettes, indicated by display tabs such as tab 310 for a "Blend" palette. As shown in FIG. 3A, a user has opened two palettes; namely, an "Align" palette displayed in window panel 320, for aligning graphic objects, and an "Attribute Styles" palette displayed in window panel 330, for setting and changing object attribute styles. Each of the window panels 320 and 330 can be moved independently by pressing on a mouse button while the mouse pointer is positioned over a window panel, and moving the mouse pointer while the mouse button remains depressed, as is conventional with windows.

Figure 3B:
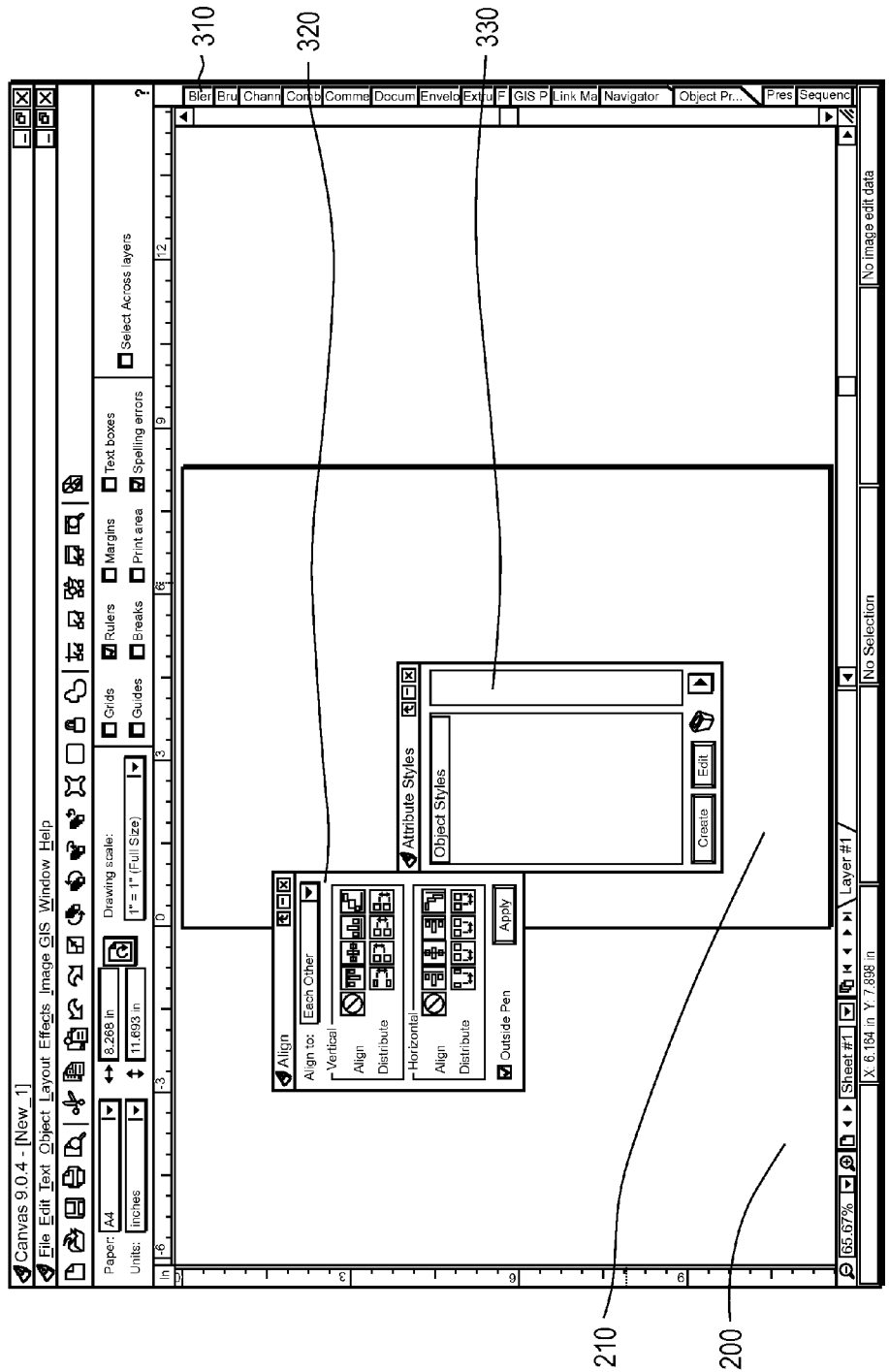

FIG. 3B shows that the user has moved window panel 330 in close proximity to window panel 320. In accordance with a preferred embodiment of the present invention, when window panels 320 and 330 are in close proximity of one another, they snap together as a union and behave as a single area, where a "union" denotes a combination of one or more window panels that are fastened together and move together rigidly.

Figure 3C:
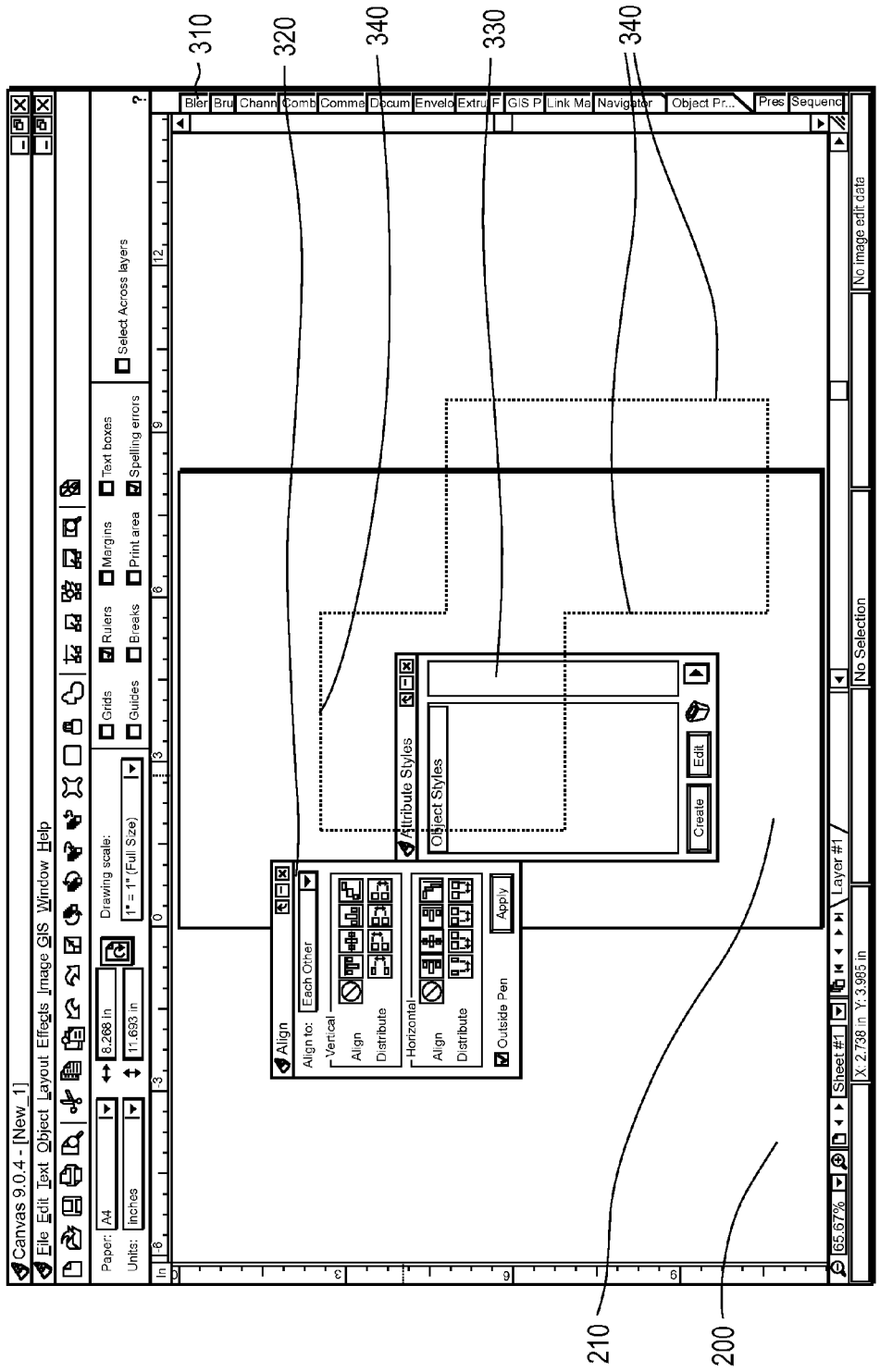
Figure 3D:
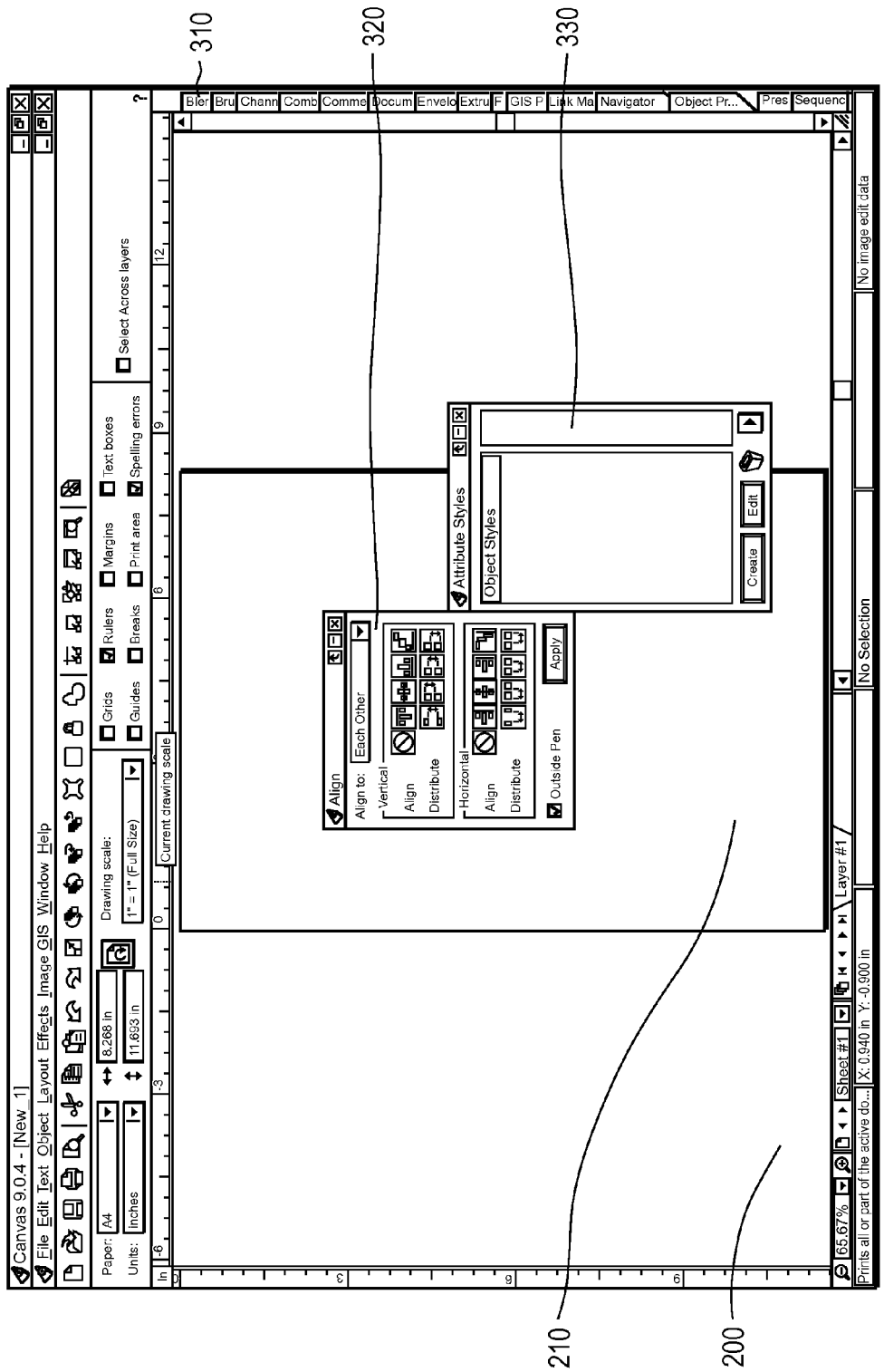

Specifically, as shown in FIG. 3C, when either window panel 320 and 330 is moved, both panels move together in unison. While the mouse button is depressed, an outline 340 is displayed as the mouse pointer is moved, indicating an area into which window panels 320 and 330 would be moved if the mouse button were released. As shown in FIG. 3D, when the mouse button is subsequently released, window panels 320 and 330 move together rigidly into the area that corresponds to outline 340.

Figure 3E:
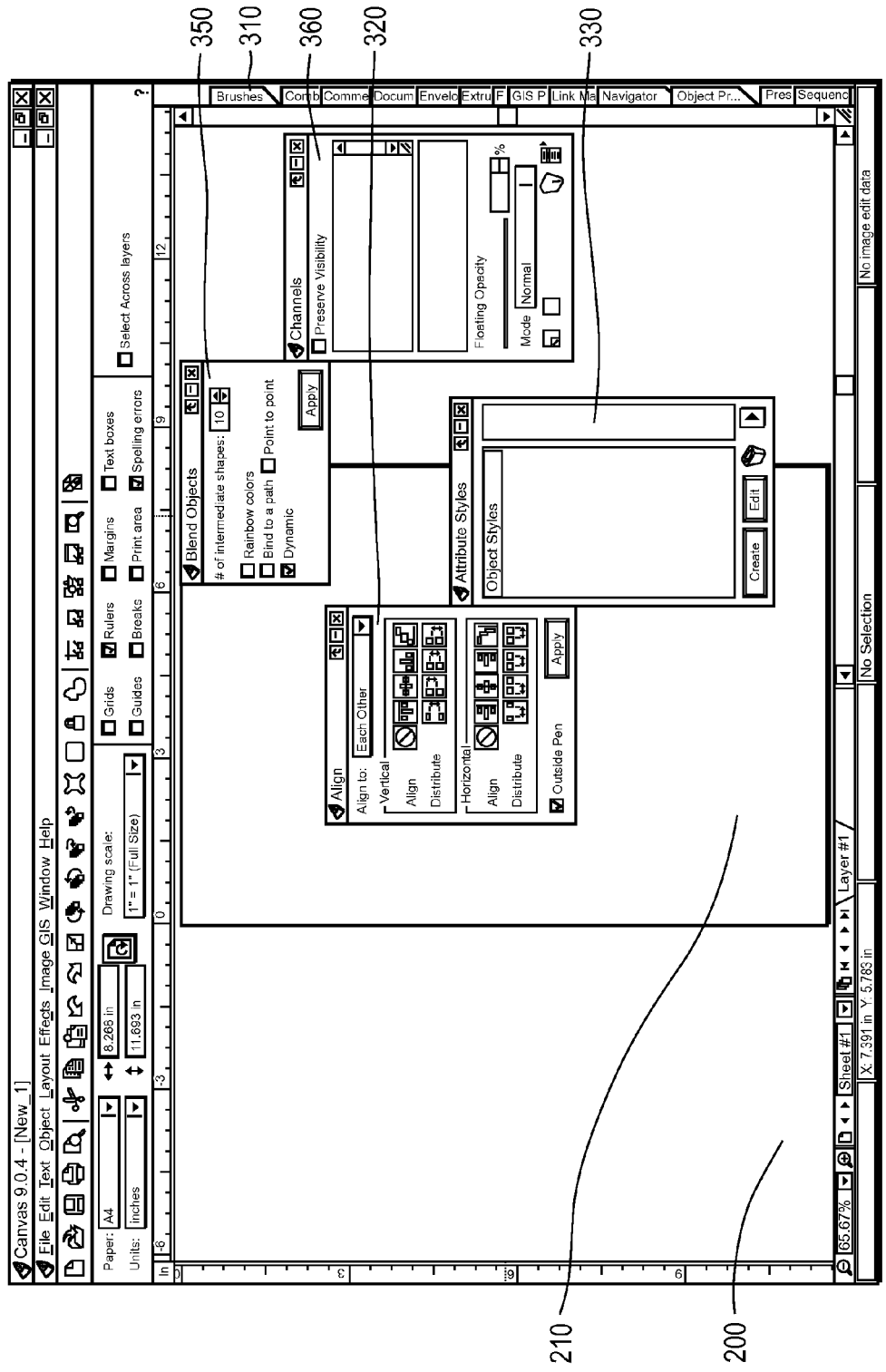

Shown in FIG. 3E are two additional window panels that are fastened together as a union. Window panel 350 includes a "Blend" palette, for blending objects, and window panel 360 includes a "Channels" palette for color channels. Window panels 350 and 360 were also in close proximity to one another, and snapped together similar to window panels 320 and 330. Each of the two-panel unions, panels 320/330 and panels 350/360, moves as a single area, and can be moved independently of the other union.

Figure 3F:
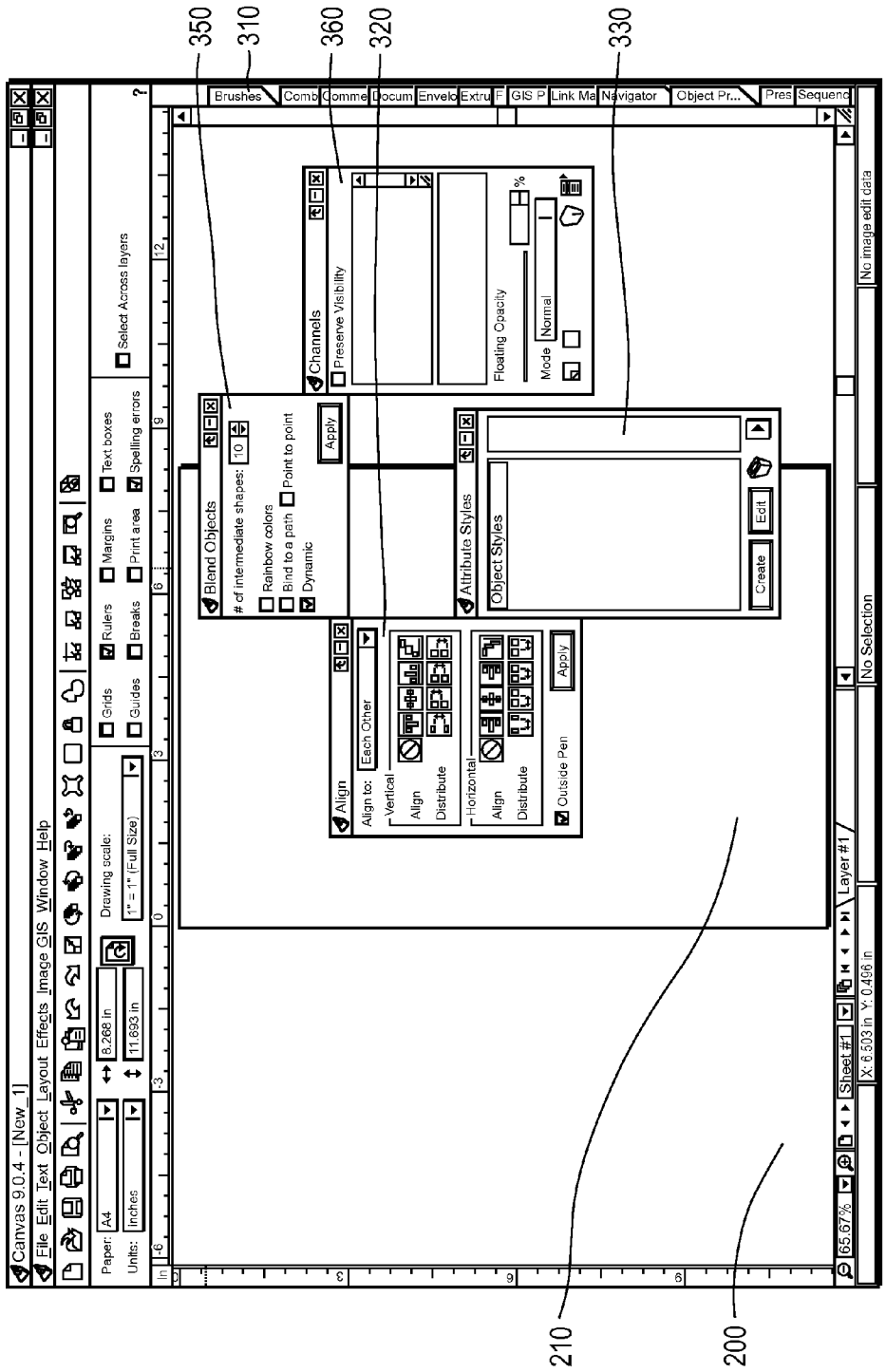

As shown in FIG. 3F, the user has moved the union 350/360 in close proximity to the union 320/330, and the two two-panel unions have fastened together to form a single four-panel union including panels 320, 330, 350 and 360. Specifically, panel 350 was moved to close proximity of panel 320, which triggered the fastening together of the two unions. The four-panel union behaves rigidly as a single area, and moving any one of the four panels causes the other three panels to move in unison.

Figure 3G:
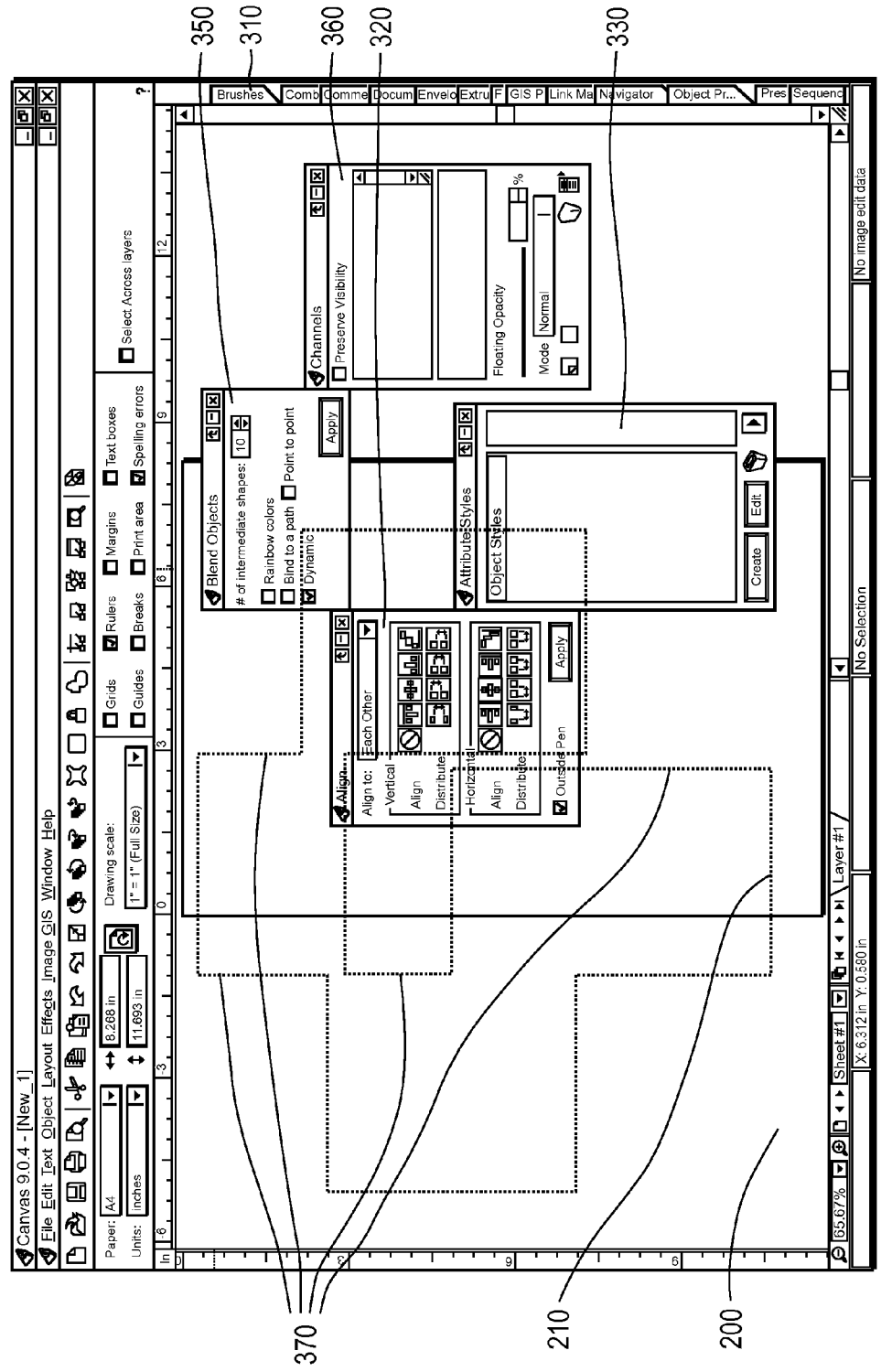
Figure 3H:
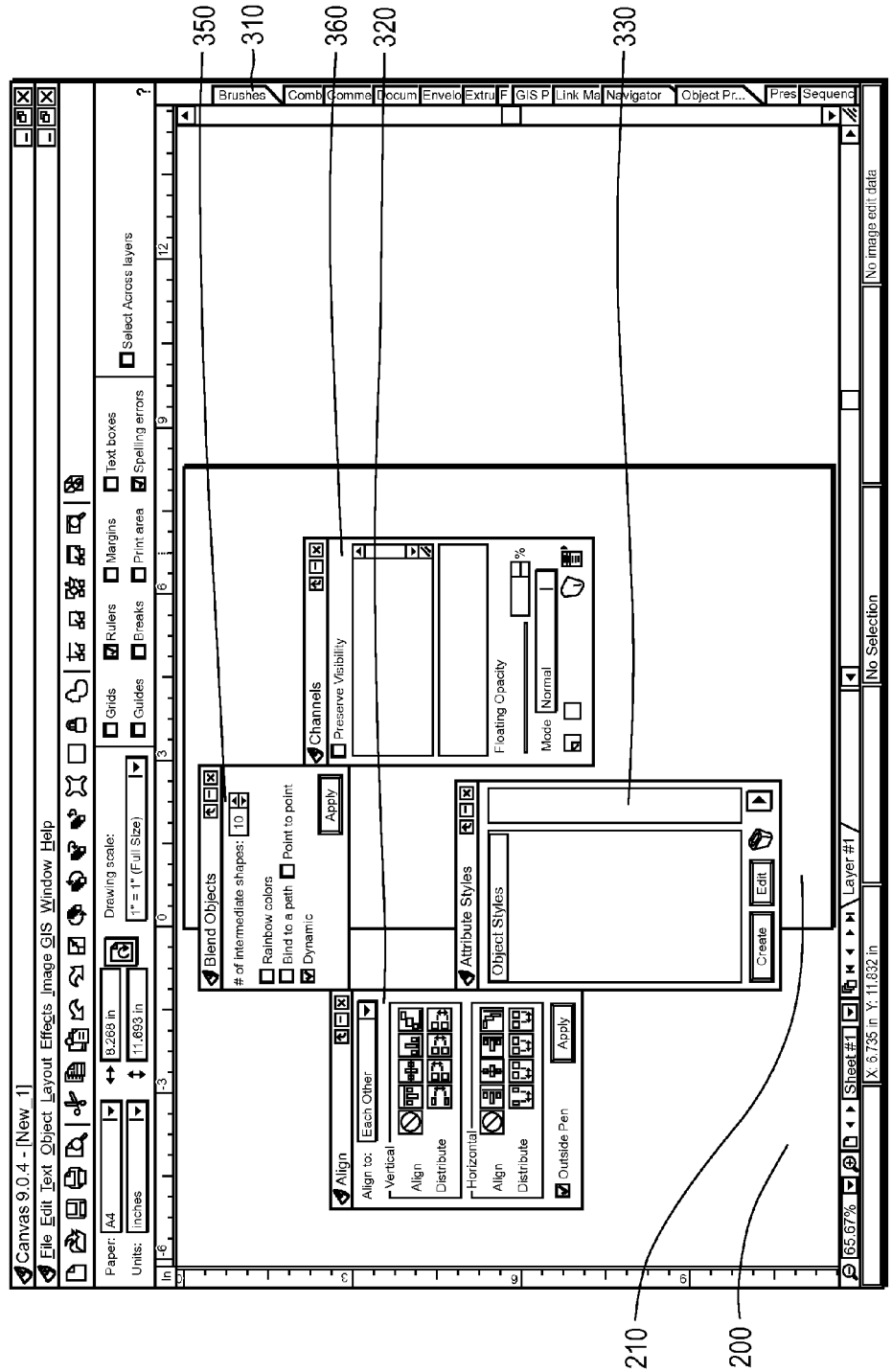
Figure 31:
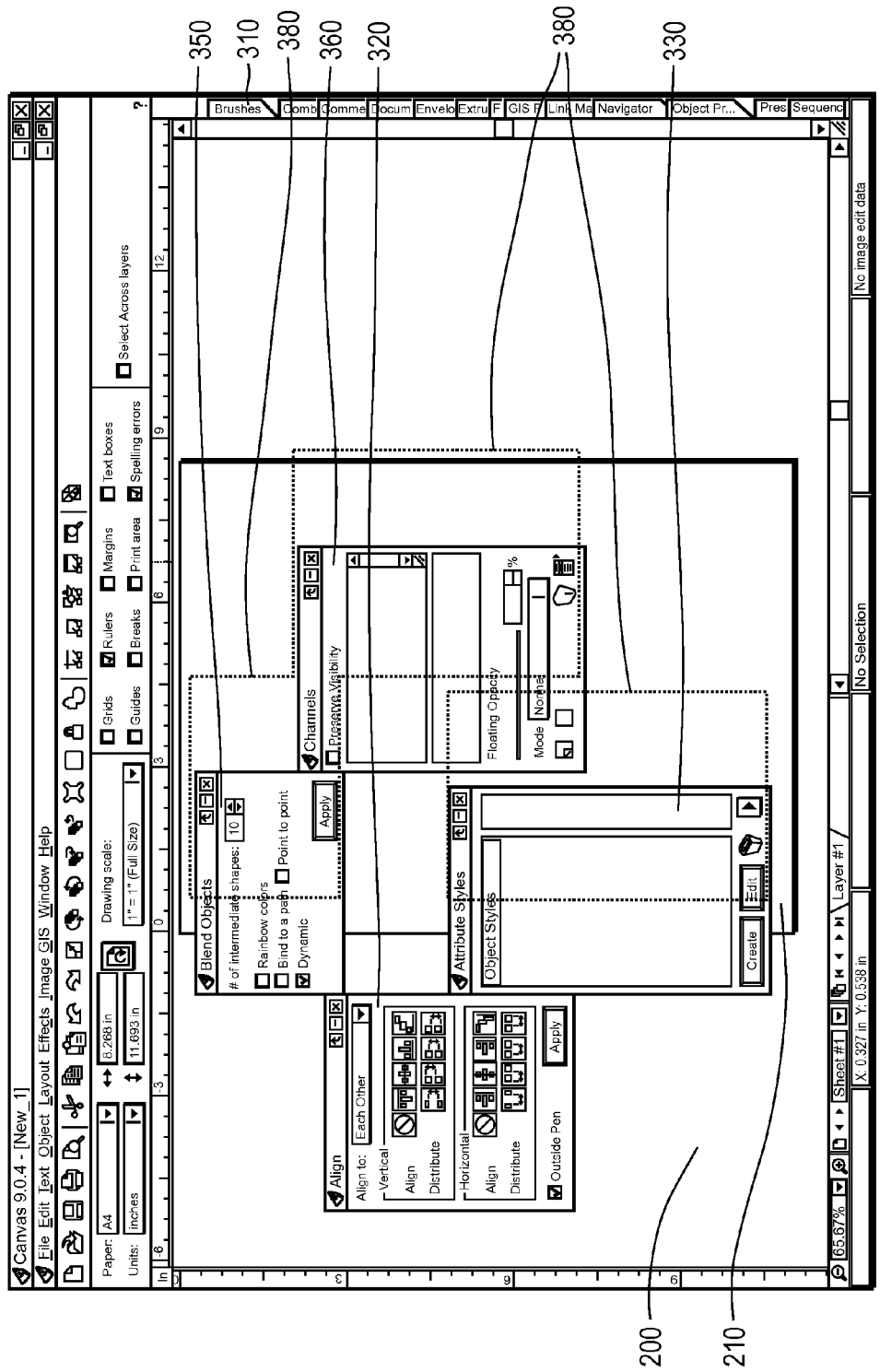

FIG. 3G shows what happens when a user presses the mouse button while the mouse pointer is positioned over one of the four panels 320, 330, 350 and 360, and moves the mouse pointer while the mouse button remains depressed. An outline 370 of the area covered by the four panels moves along with the mouse pointer, indicating where the union will be moved if the mouse button is released. FIG. 3H shows how the union has been moved into the position of outline 370.

In a preferred embodiment of the present invention, the user is able to break apart a union of window panels into two smaller unions. Specifically, two actions are enabled:

Use of the shift key: If the user moves a window panel that is part of a union of panels while pressing and holding down the "shift" key of a keyboard, then that window panel alone is moved and separated from the union, and the other panels remain fixed.

Use of the control key: If the user moves a window panel that is part of a union of panels while pressing and holding down the "control" key of the keyboard, then that window panel and all other window panels of the union that are positioned below and to the right of it are moved and separated from the original union as a smaller union, while the other panels remain fixed.

Positioning of a window panel is preferably determined by the coordinates of the top left corner of the panel, although other conventions may be used, such as a different corner of the panel or the center of the panel. Coordinates are generally measured within the display screen relative to the top left corner of the screen. A first panel positioned at (x, y)

within the display screen, is positioned below and to the right of a second panel positioned at (u, v) within the screen, if u≤x and v≤y.

Figure 3J:
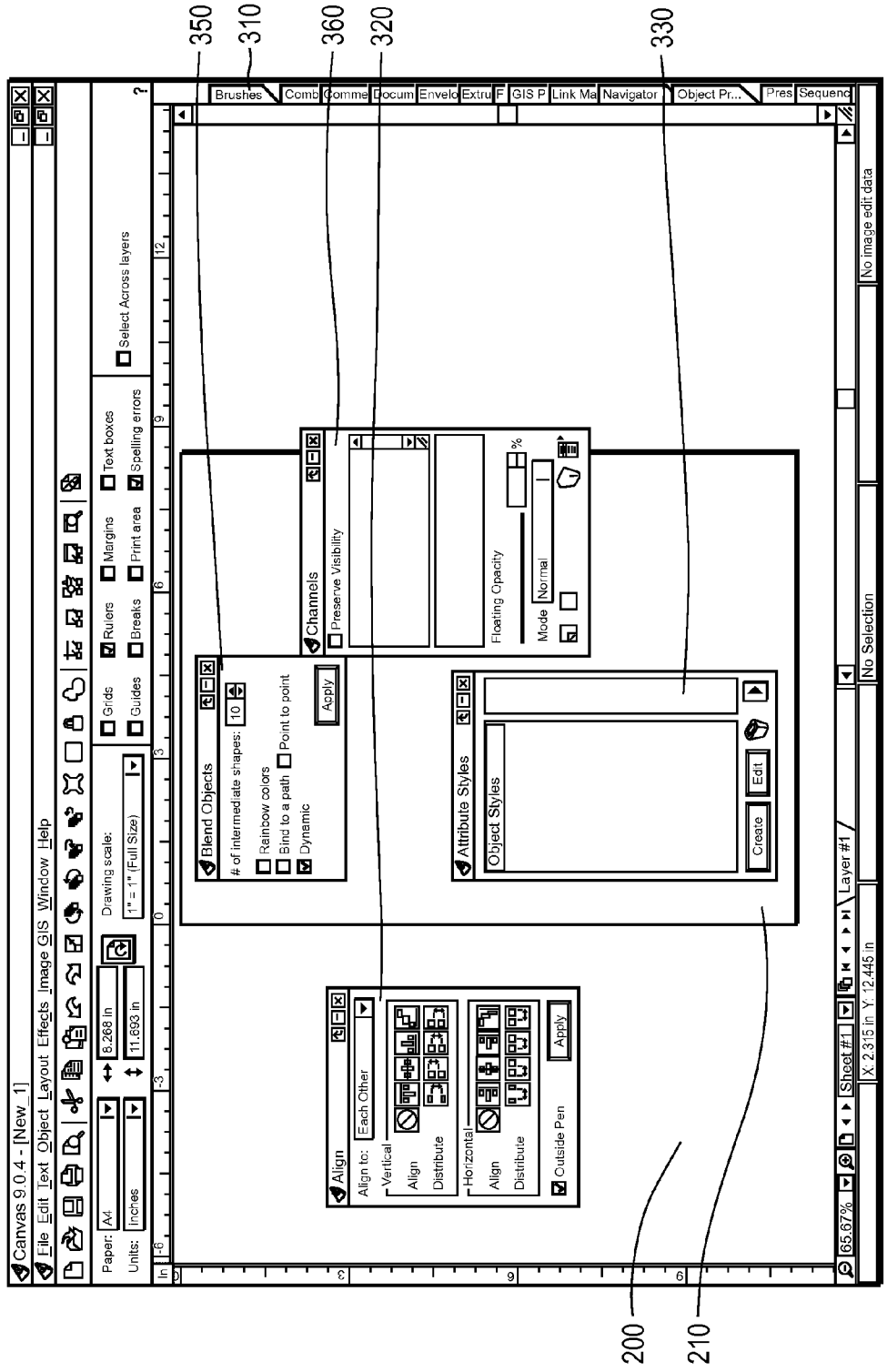

Referring to FIG. 3I, window panels 330 and 360 are each positioned below and to the right of window panel 350. As such, if panel 350 is moved while the control key is depressed, panels 330 and 360 are moved together with it, but panel 320 remains fixed. This action breaks apart the four-panel union 320/330/350/360 into a three-panel union 330/350/360 and a single-panel union 320. An outline 380 in the shape of the three-panel union indicates the place where this union will be positioned if the mouse button is released. FIG. 3J shows the three-panel union 330/350/360 having been moved to the position of outline 380, and the single-panel union 320 having remained fixed. The original four-panel union 320/330/350/360 shown in FIG. 3I has thus been decomposed into the three-panel union and the one panel union shown in FIG. 3J.

The two actions described hereinabove; namely, moving a single panel by use of the shift key, and moving a panel with other panels positioned below and to the right of it by use of the control key, provide the user with flexibility in pulling apart a general union of panels into two or more smaller unions.

Figure 4A:
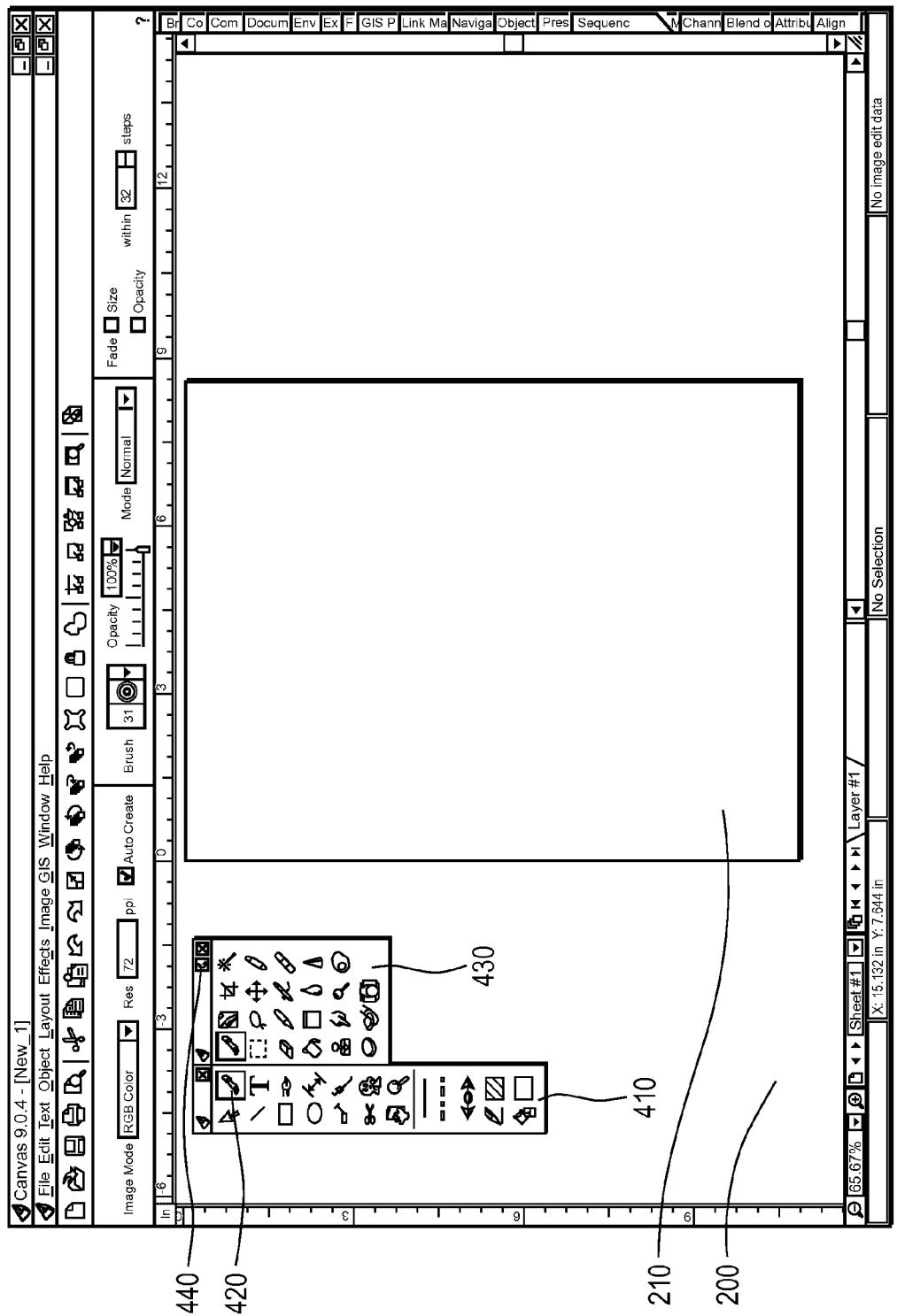
FIGS. 4A-4G are illustrations of fastening parent and child window panels together and locking the child window panels, in accordance with a preferred embodiment of the present invention.
Figure 4B:
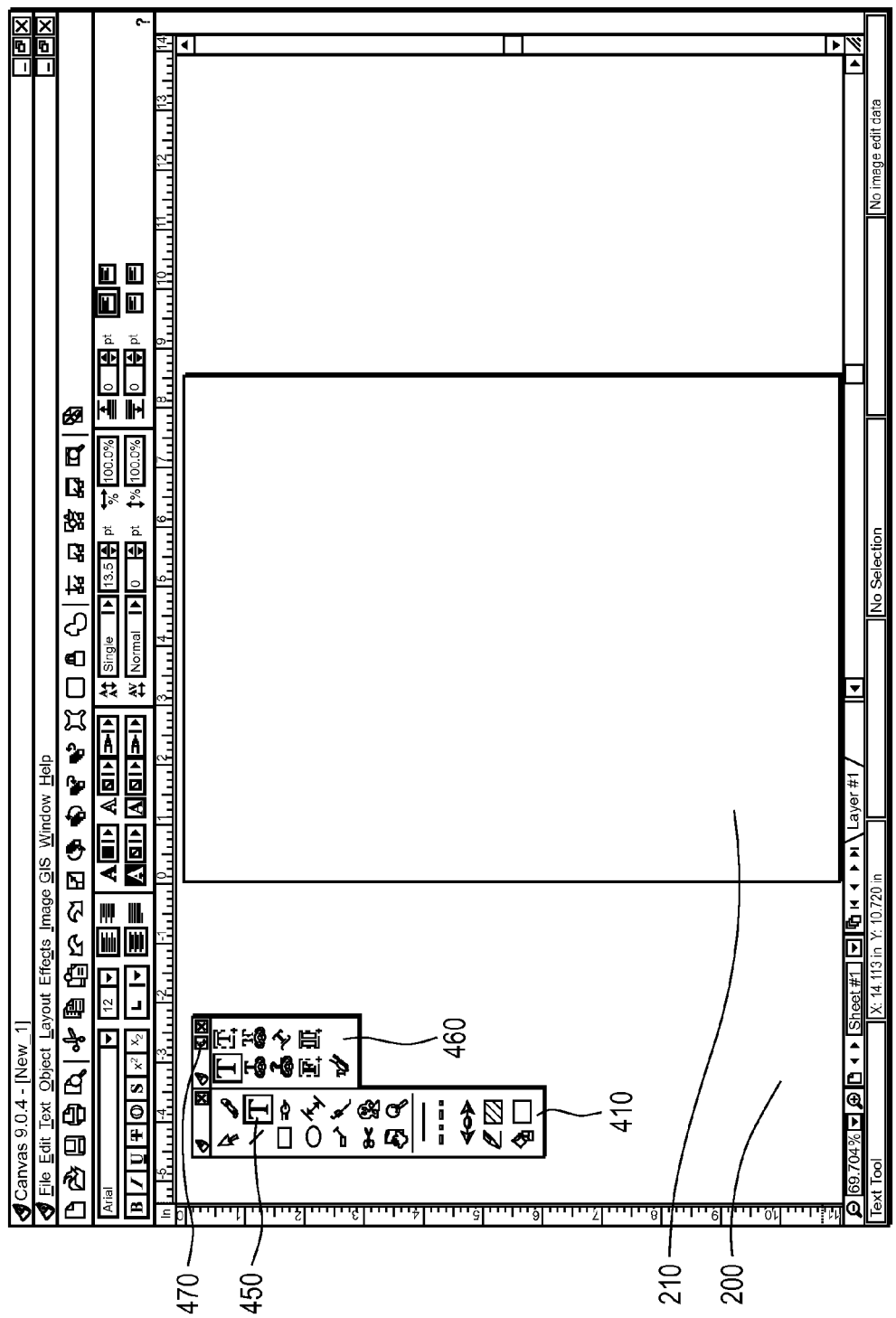

Reference is now made to FIGS. 4A and 4B, which are illustrations of fastening parent and child window panels together and locking the child window panels, in accordance with a preferred embodiment of the present invention. Shown in FIG. 4A is a window panel 410 for a toolbox, containing a variety of graphics tools represented as icons. Pressing a mouse button while the mouse is pointed over an icon, such as brush icon 420, triggers opening of a child window panel 430 for a toolbox of brush strokes. Referring back to FIG. 2A, the parent window panel 410 for the toolbox is accessible as the second item in pop up list 230.

When child panel 430 is opened, it is positioned adjacent to its parent panel 410, and the two panels are fastened together to form a union, as described hereinabove with reference to FIG. 3B. Thus if a user moves either panel 410 or 430, the other panel automatically moves with it in coordination. If the user wishes to decompose the union of panels 410 and 430 and move one of the panels without moving the other, he can press the shift key or the control key while moving one of the panels, as described above with reference to FIG. 3I.

In accordance with a preferred embodiment of the present invention, when a second child panel is opened, the first child panel is closed in its stead, unless the first child panel has been locked. Specifically, referring to FIG. 4B, the user has pressed on icon 450 for a text tool, and accordingly child panel 460 with a variety of text tools is opened and positioned alongside parent panel 410, instead of child panel 430 with the brush stroke tools, which has now been closed. However, it is possible for both child panels 430 and 460 to simultaneously be open, by use of a locking mechanism. Referring back to FIG. 4A, child panel 430 includes a lock 440 which, if pressed by the user, ensures that child panel 430 remains open when another child panel is subsequently opened. When lock 440 is pressed, child panel 430 is said to be "locked", otherwise it is said to be "unlocked".

Figure 4C:
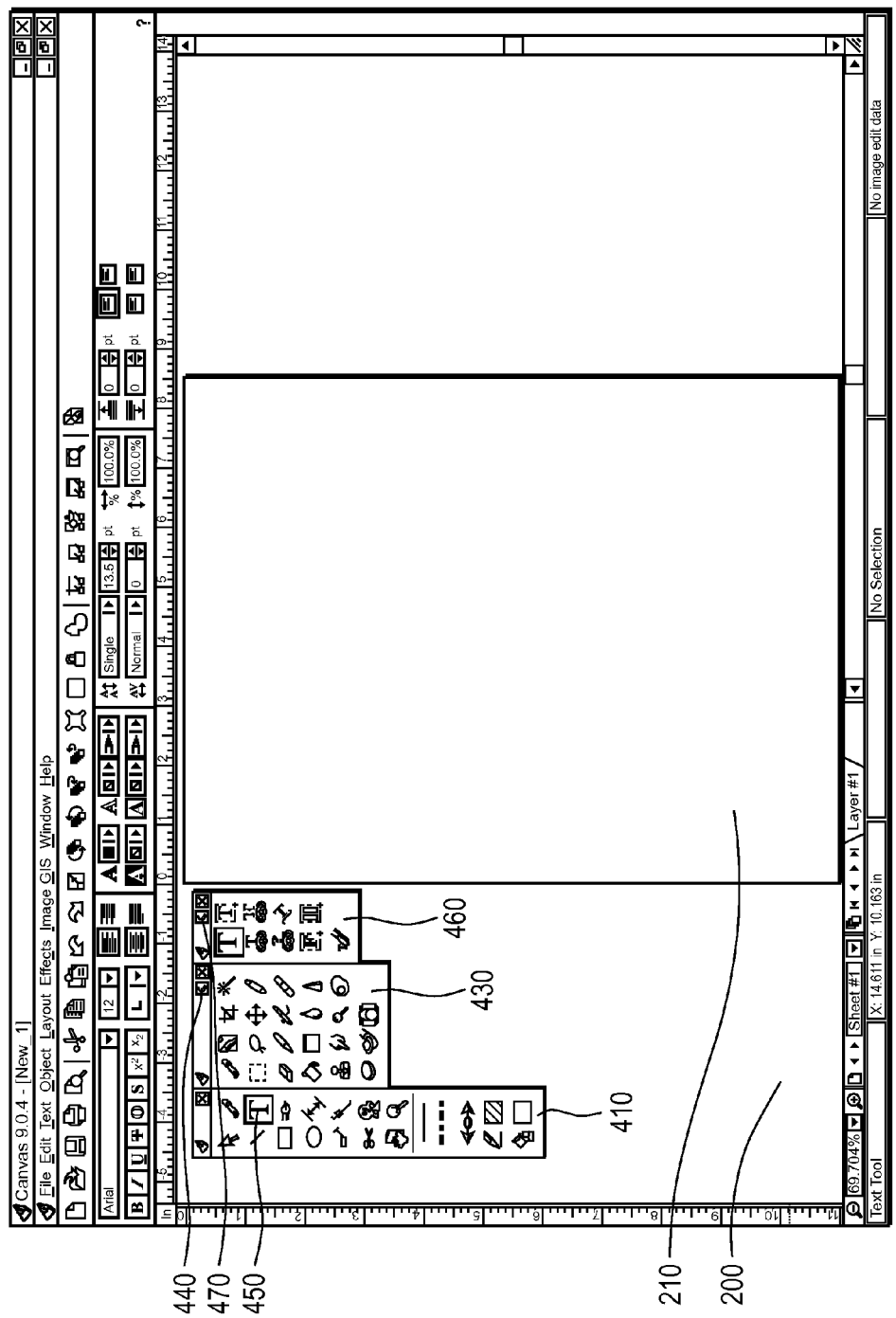

In distinction from FIG. 4B in which child panel 430 was unlocked and therefore closed, FIG. 4C shows what happens if child panel 430 was locked prior to opening the second child panel 460. Lock 440 is shown in FIG. 4C depressed. When the user clicks on icon 450, child panel 430 is maintained and the new child panel 460 for text is opened and displayed alongside child panel 430.

Figure 4D:
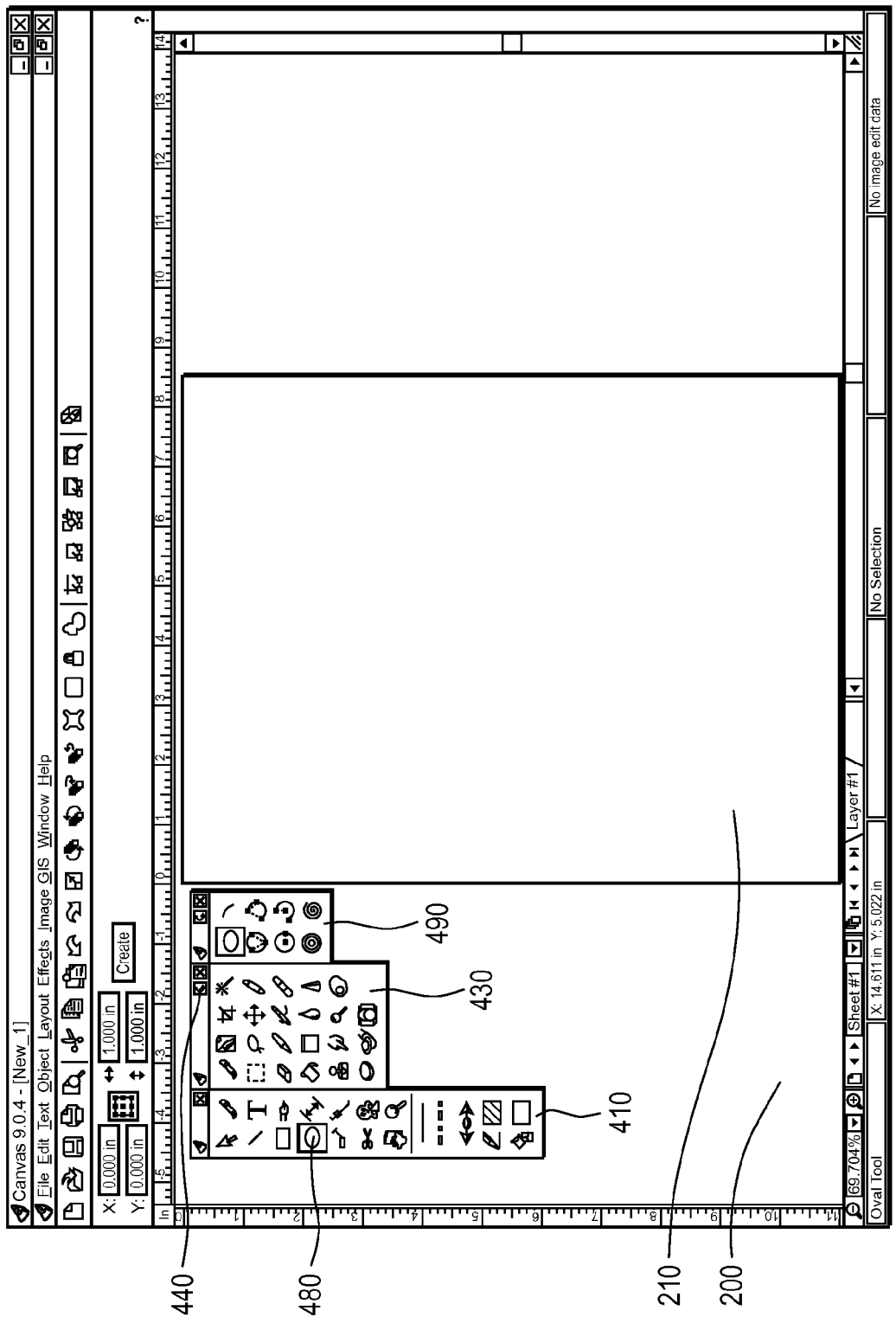

The process of opening successive child panels can be repeated, and preferably whenever a new child panel is opened, those previous child panels that were locked remain open, and those that were unlocked are closed. Thus, referring to FIG. 4D, after opening child panel 430 for brush strokes and child panel 460 for text tools, a user opens yet a third child panel by clicking in an icon 480 for ellipse tools. Prior to this, child panel 430 was locked, as shown in FIG. 4C with lock 440 depressed. However, child panel 460 was not locked, as shown in FIG. 4C with lock 470 released. As a result, when a new child panel 490 for ellipse tools is opened in FIG. 4D, child panel 430 remains open and child panel 460 is closed. Thus only child panels 430 and 490 appear in FIG. 4D, and not child panel 460, which was closed.

Figure 4E:
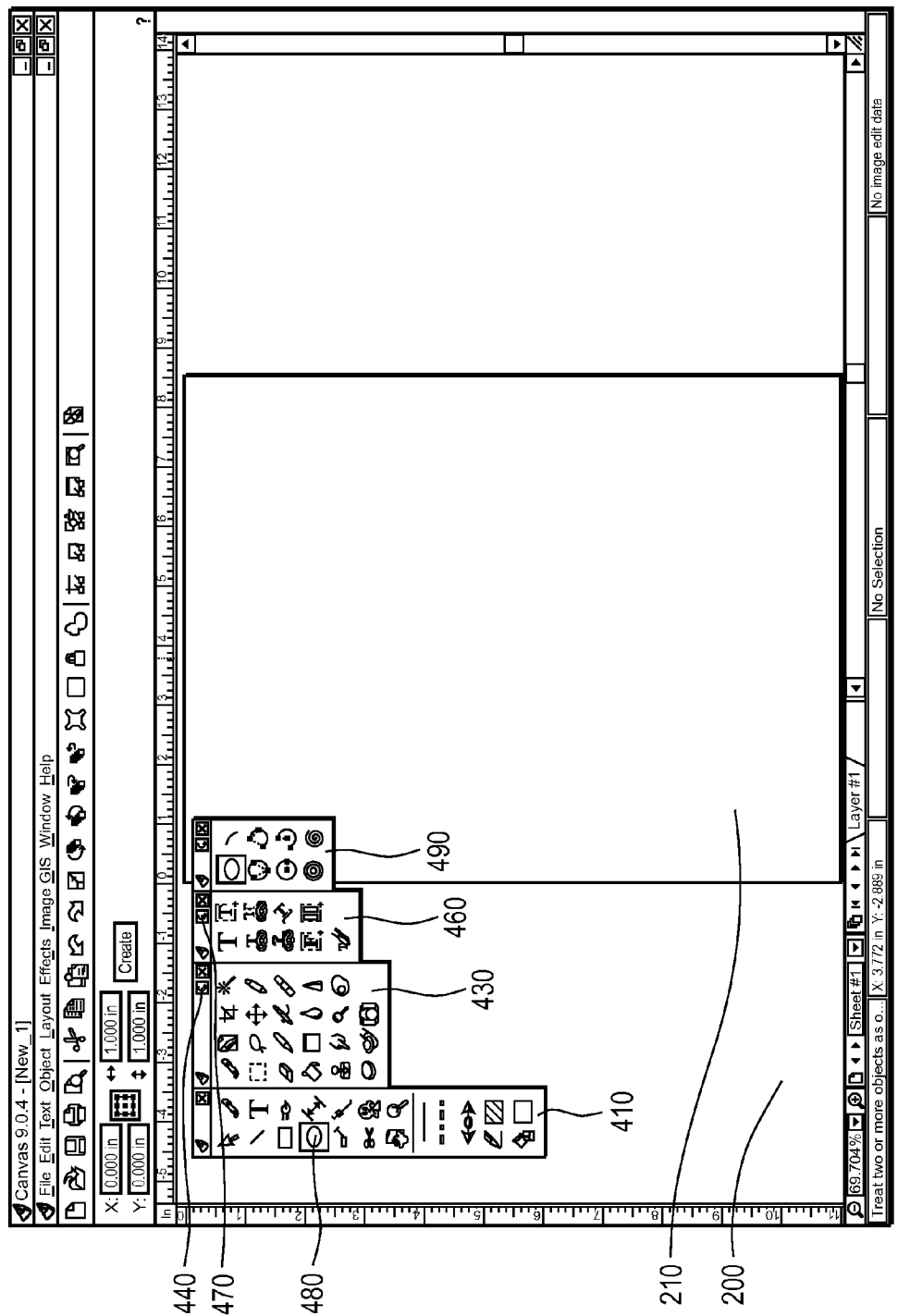

Alternatively, if lock 470 for child panel 460 had been pressed, then child panel 460 would also remain open, as illustrated in FIG. 4E. As shown in FIG. 4E, lock 440 for child panel 430 and lock 470 for child panel 460 are both depressed, and the new child panel 490 is opened alongside of child panel 460.

Figure 4F:
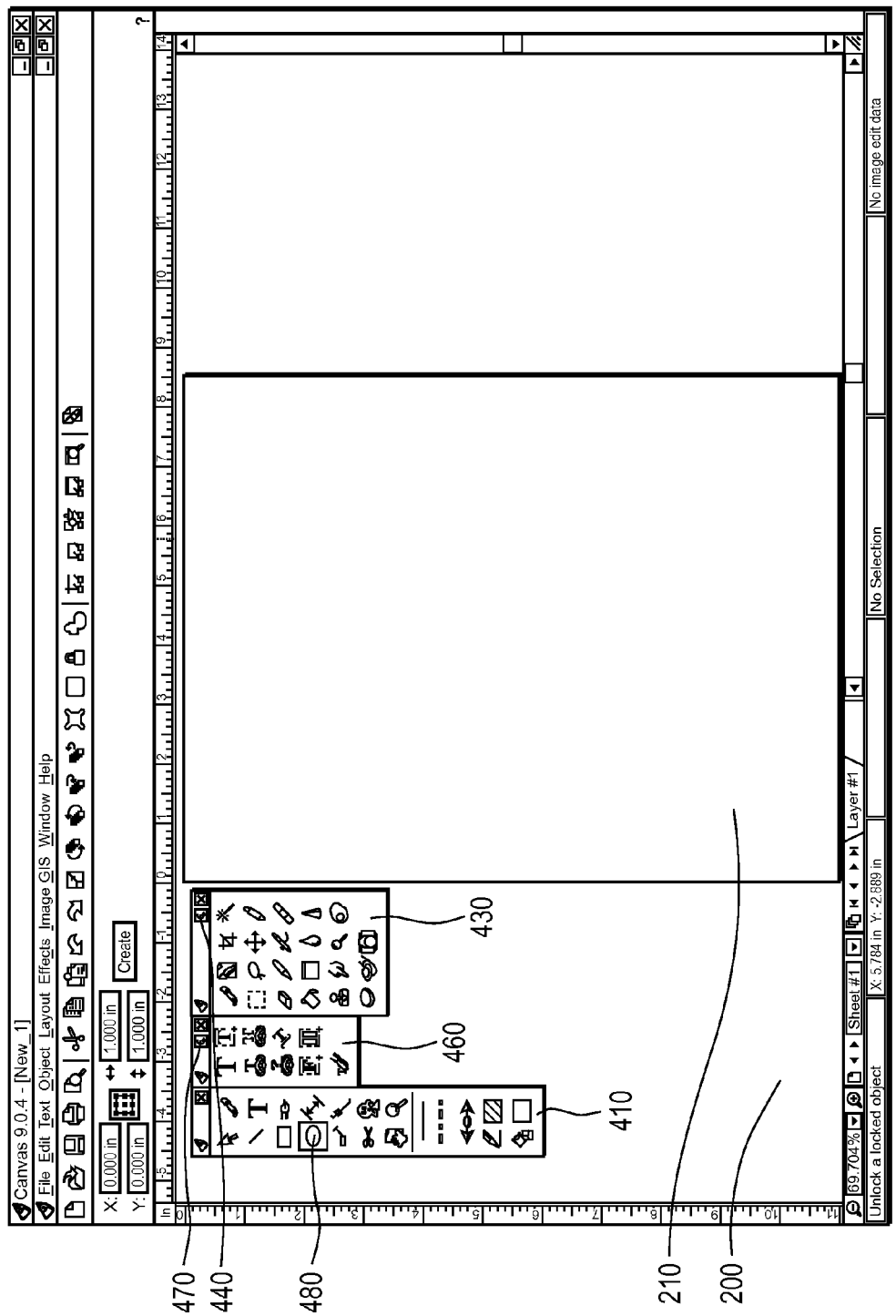

In accordance with a preferred embodiment of the present invention, child panels are positioned so that the unlocked panels are to the right of the locked panels. Thus, in FIG. 4C child panel 430 is locked and child panel 460 is unlocked, and the latter is positioned to the right of the former. If the locks are switched, by releasing lock 440 and pressing lock 470, then the positioning of the child panels is also switched, as shown in FIG. 4F. That is, in FIG. 4F, lock 440 is released and lock 470 is pressed, and accordingly child panel 430 is now positioned to the right of child panel 460.

Figure 4G:
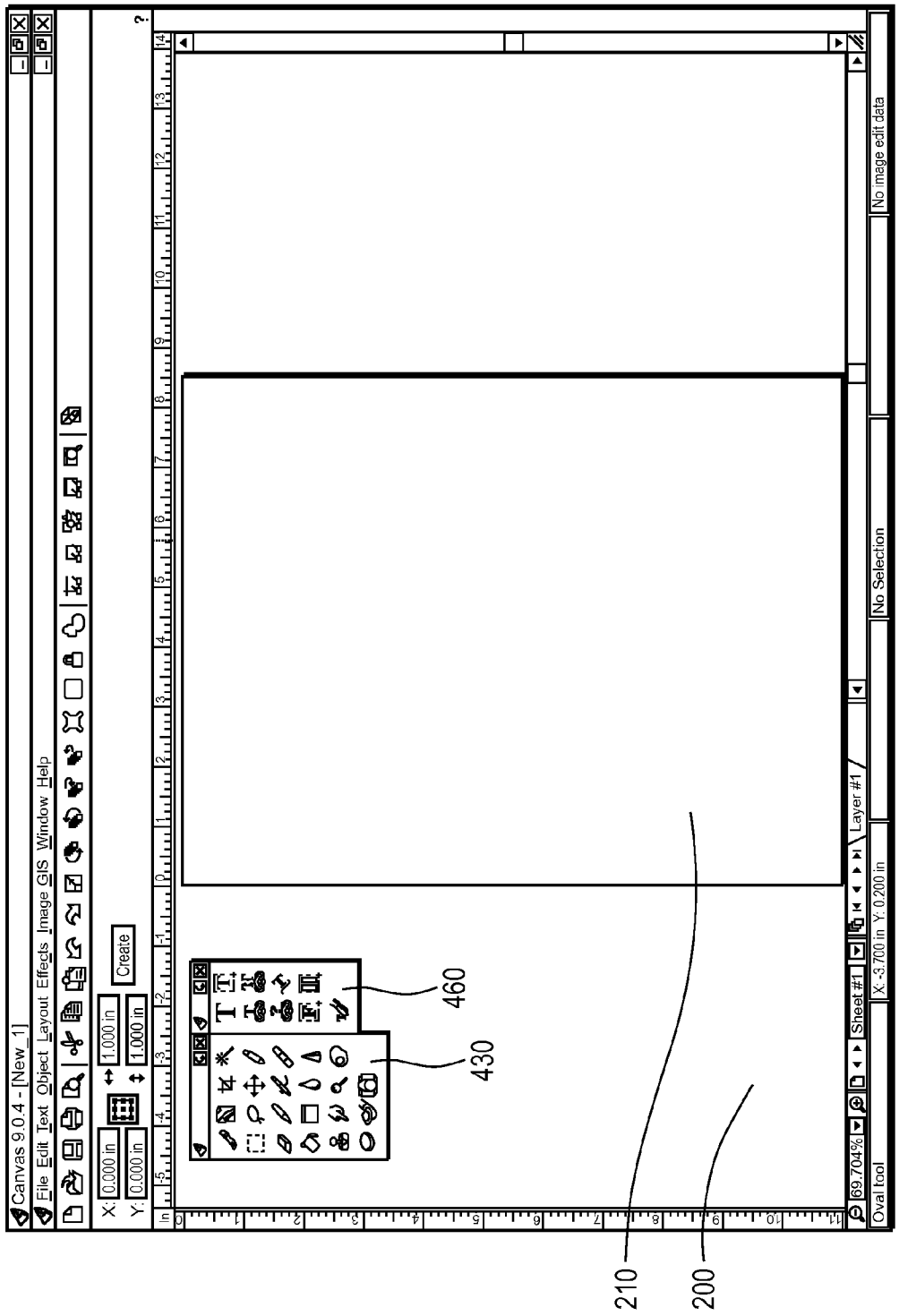

In accordance with a preferred embodiment of the present invention, when a parent window panel is closed, the unlocked child window panels automatically close as well, but the locked child panels remain open. Referring back to FIG. 4E, child panels 430 and 460 are locked, and child panel 490 is unlocked. Referring to FIG. 4G, if the parent panel 410 is closed, then child panels 430 and 460 remain open, and child panel 490 is automatically closed.

The present invention provides a method and system for managing a context-dependent display bar, also referred to herein as a "property bar," that includes controls relevant for a current context in which a user is working; and for generating the display bar as a multi-page bar for drawing the relevant controls.

Figure 5A:
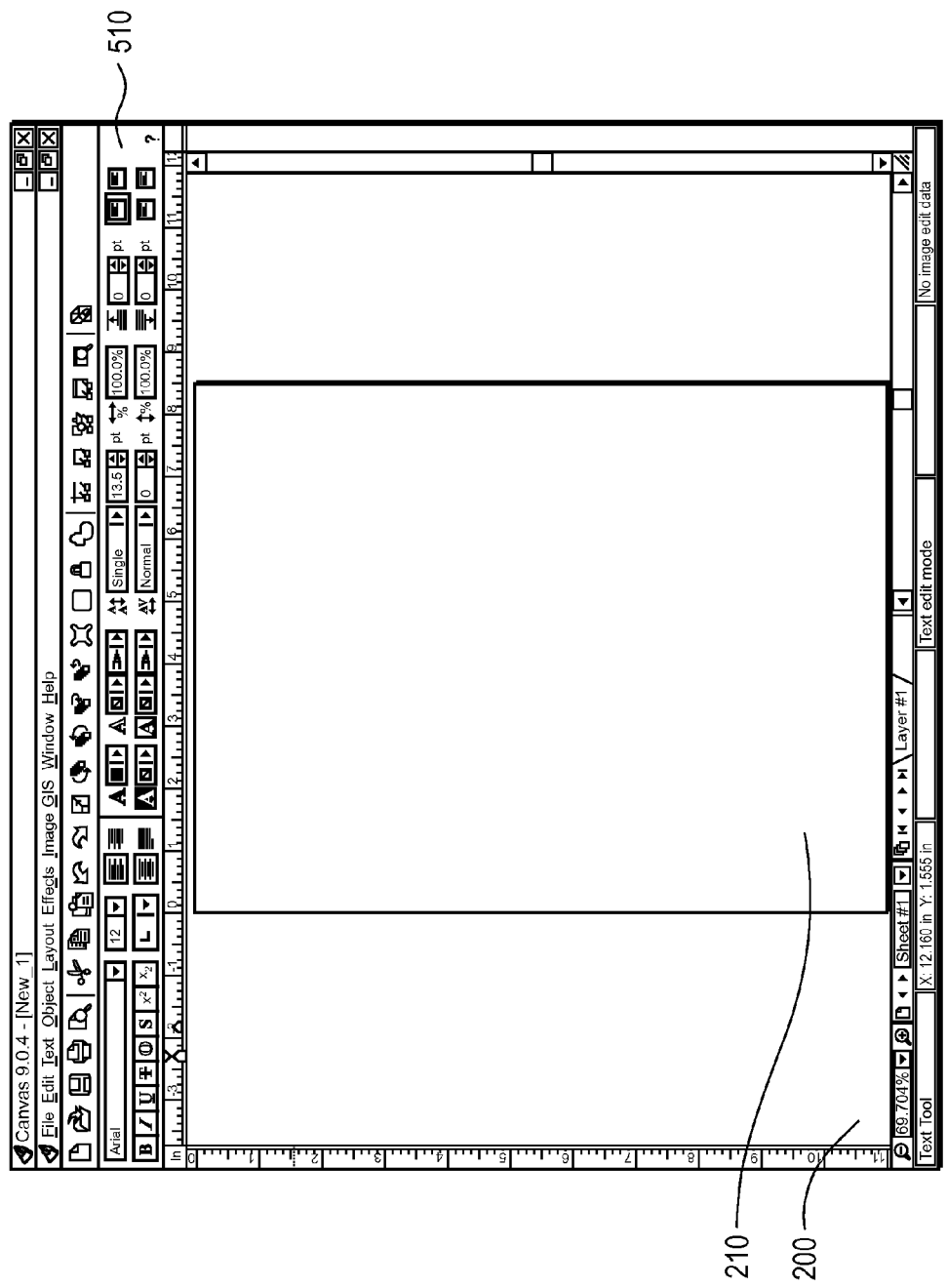
FIGS. 5A-5D are illustrations of a multi-page property bar, in accordance with a preferred embodiment of the present invention.

Reference is now made to FIGS. 5A-5D, which are illustrations of a multi-page display bar, in accordance with a preferred embodiment of the present invention. Shown in FIG. 5A is a property bar 510 with controls for text and artistic properties. The Canvas application window 200 is large enough for all of the necessary controls to fit within property bar 510.

Figure 5B:
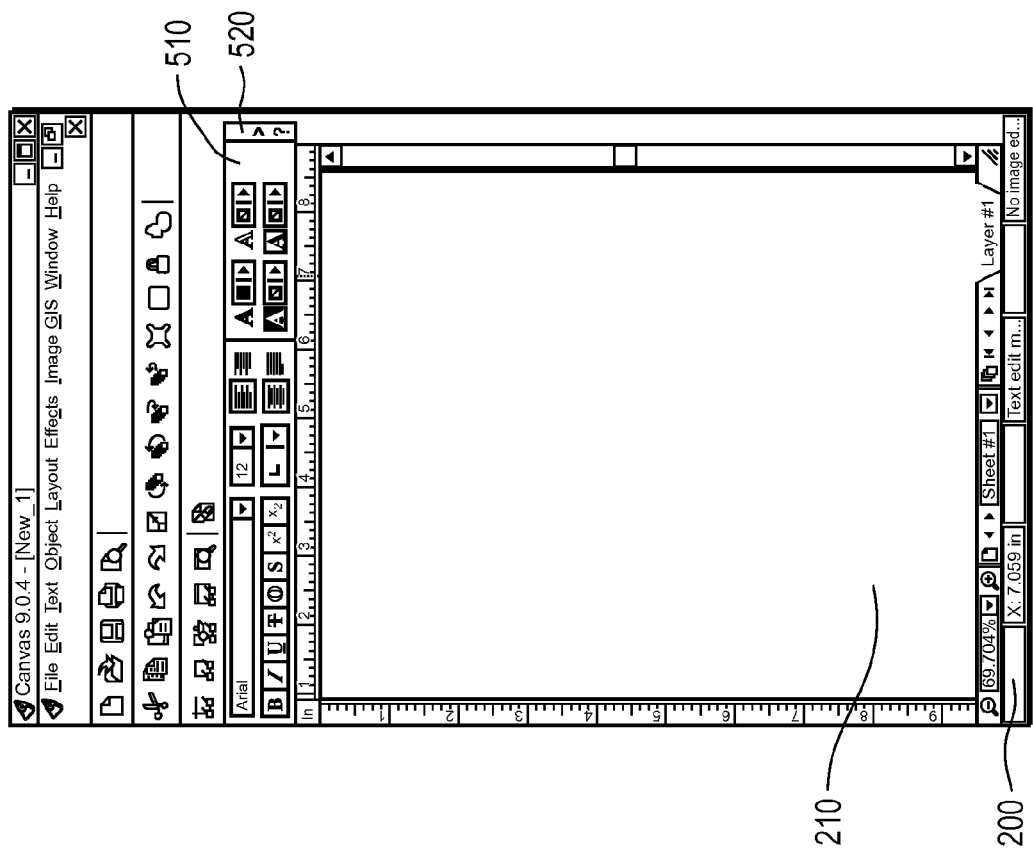
Figure 5C:
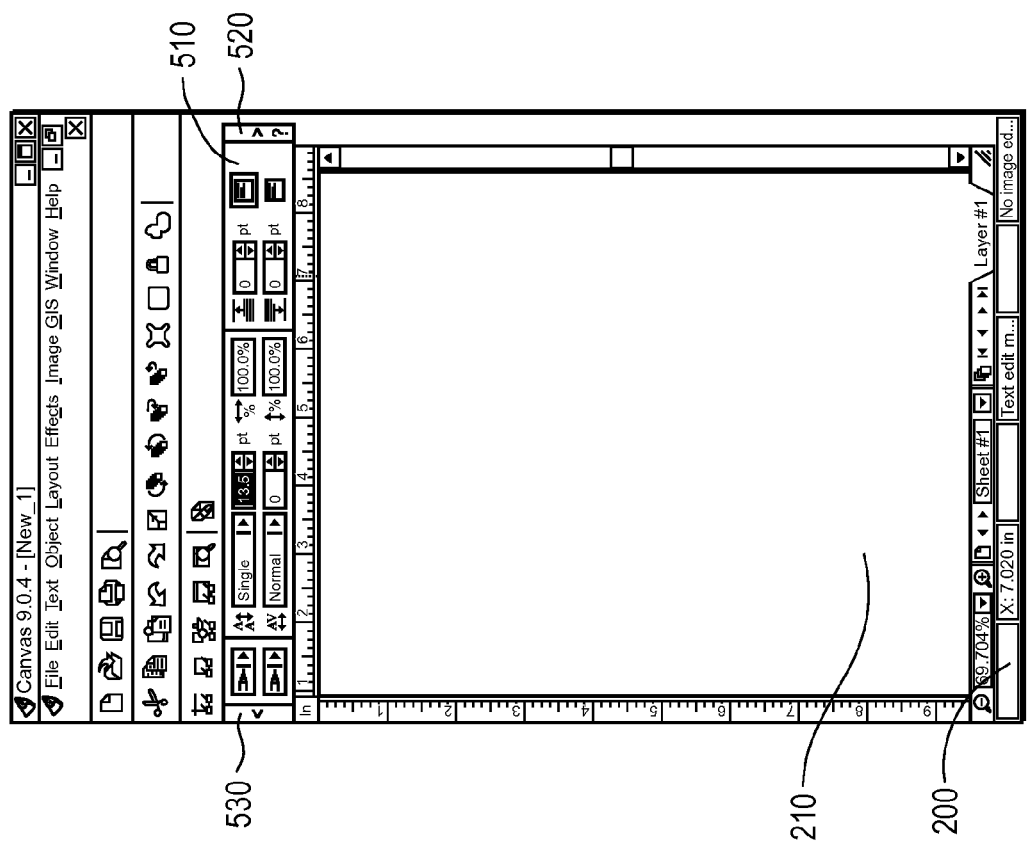

As shown in FIG. 5B, a user has resized application window 200 to reduce its width, and property bar 510 is no longer wide enough to display all of the necessary controls. Only a subset of the controls is visible in property bar 510, and the rest of the controls are hidden. In accordance with a preferred embodiment of the present invention, in order to enable a user to access the hidden controls, a paging button 520 is provided. Button 520 enables the user to page through the controls, one page at a time. When the user presses on button 520, the next page of controls is displayed in property bar 510, as illustrated in FIG. 5C. A portion of the controls that were hidden in FIG. 5B, are now displayed in property bar 510 in FIG. 5C, and the controls that were visible in FIG. 5B are now hidden in FIG. 5C.

Figure 5D:
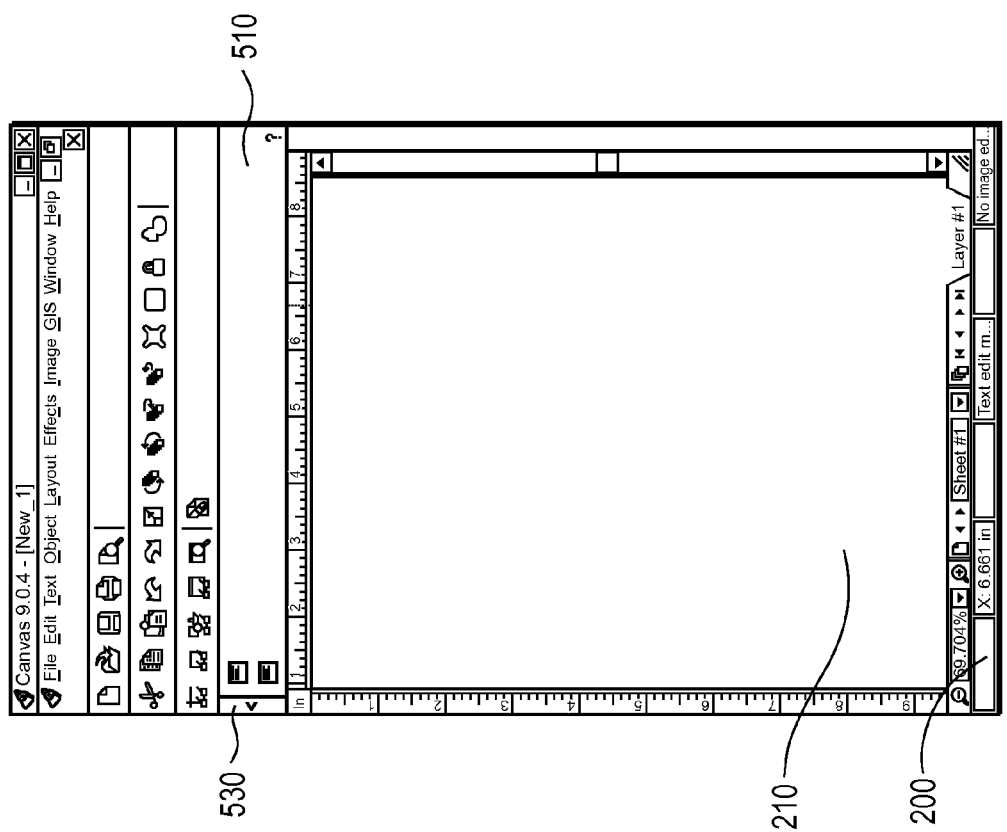

FIG. 5C includes button 520 for advancing to the next page of icons, and also button 530 for going back to the previous page of icons. Since three pages are necessary to display all of the controls, both buttons 520 and 530 appear in FIG. 5C, which displays the second page of controls in property bar 510. If the user clicks on button 530 to go back one page, then the first page of controls is displayed in property bar 510, as in FIG. 5B. If the user clicks on button 520 to go forward one page, then the third page of controls are displayed in property bar 510, as illustrated in FIG. 5D. FIG. 5D does not include button 520, since the last page of controls is being displayed in property bar 510, and there is no fourth page to advance to. However, FIG. 5D does include button 530 for going back to the second page of controls, as in FIG. 5C.

If application window 200 is further reduced in width, then additional pages may be required to accommodate all of the necessary controls, and if application window 200 is enlarged in width, then fewer pages may be required.

Thus it may be appreciated that the present invention provides a paging mechanism to enable a user to access controls that are not visible within a property bar.

Figure 5E:
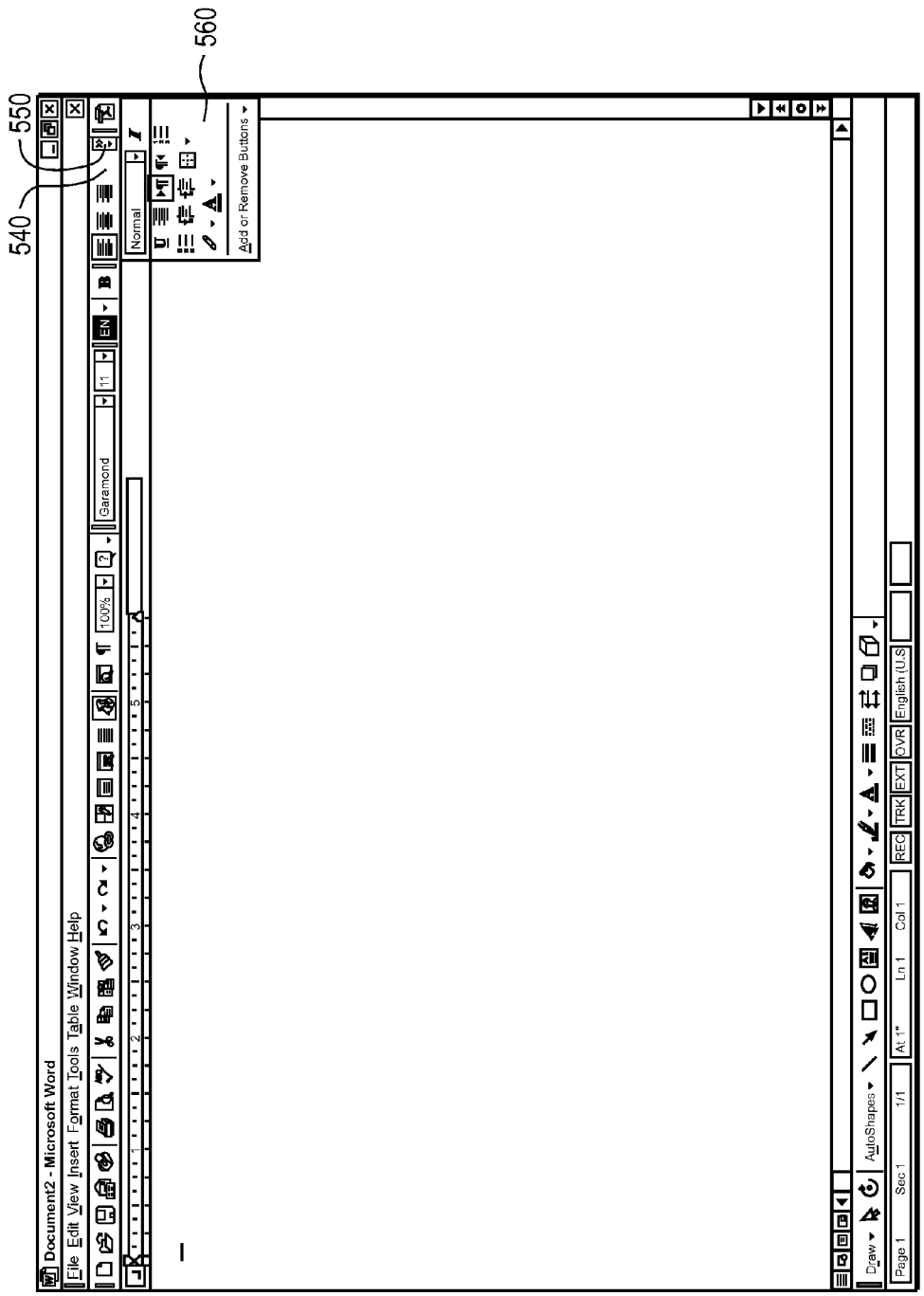
FIG. 5E is a prior art illustration of a property bar displayed within a software application.

In distinction to the present invention, prior art methods and systems provide a different approach to enable a user to access hidden controls. Referring to FIG. 5E, a property bar 540 is not wide enough to accommodate all of the necessary controls. Some of the controls are visible within property bar 540, and others are hidden. To access the hidden controls, a button 550 is provided. When a user presses on button 550, the hidden controls are displayed within an area 560 adjacent to button 550. Area 560 is removed if the user clicks anywhere outside of area 560, or presses on an Alt or Esc key of a keyboard connected to his computer.

The present invention has several advantages over prior art approaches, when there are many hidden controls, and when a user requires frequent access to hidden icons.

Figure 6A:
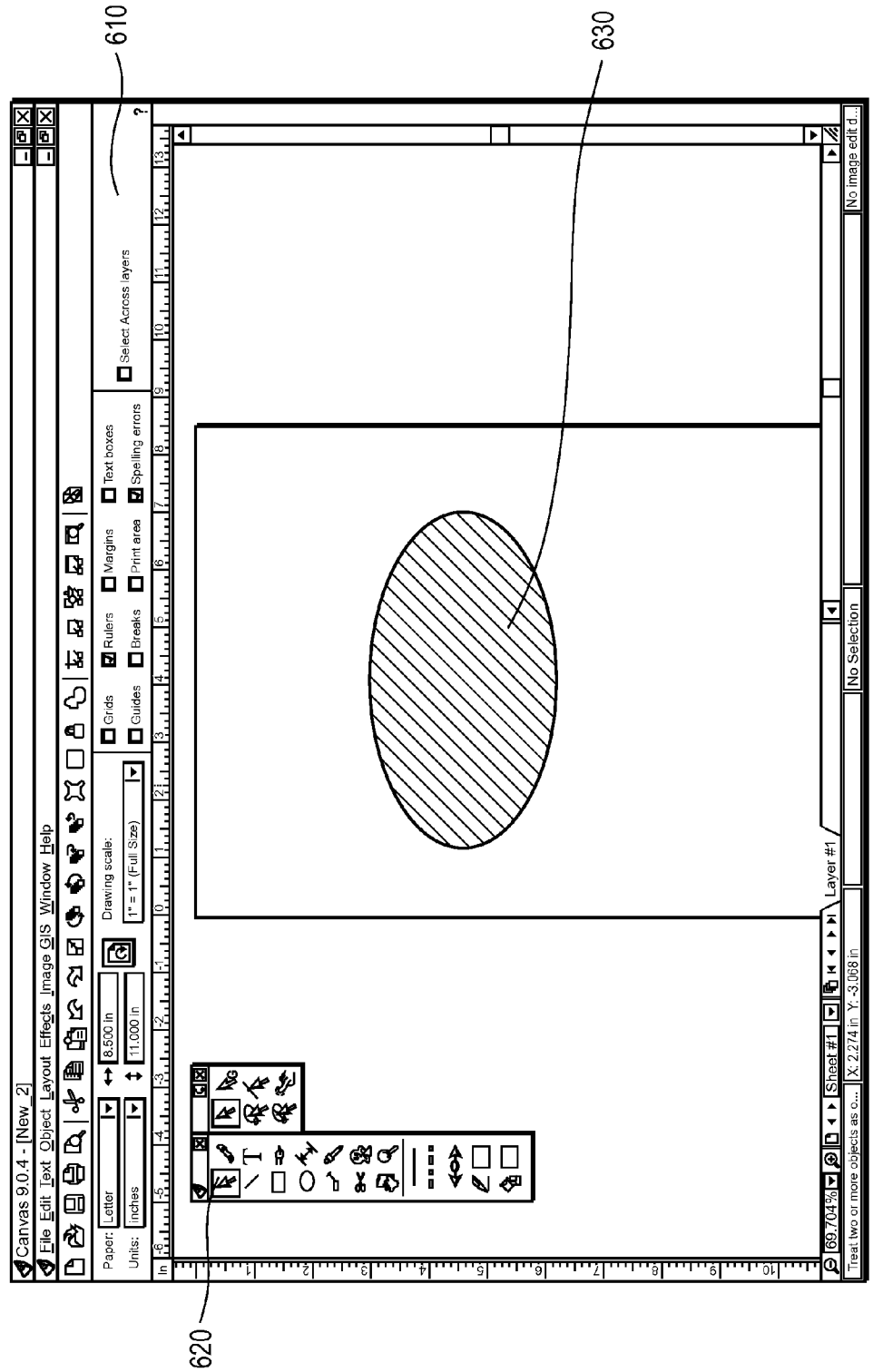
FIGS. 6A-6F are illustrations of a context-dependent property bar, in accordance with a preferred embodiment of the present invention.

In accordance with a preferred embodiment of the present invention, the property bar shown in FIGS. 5A-5D, which contains the various controls, is itself context-dependent. I.e., the set of controls included within property bar 510 can change, and depends on the context in which a user is working. Reference is now made to FIGS. 6A-6E, which are illustrations of a context-dependent property bar, in accordance with a preferred embodiment of the present invention. Property bar 610 in FIG. 6A corresponds to a context where a selection tool 620 is activated. FIG. 6A also shows an elliptical vector object 630, which is not currently selected. Thus, the context of FIG. 6A is one where a user is not currently editing his document. Accordingly, property bar 610 includes controls for document properties such as page size, units and drawing scale.

Figure 6B:
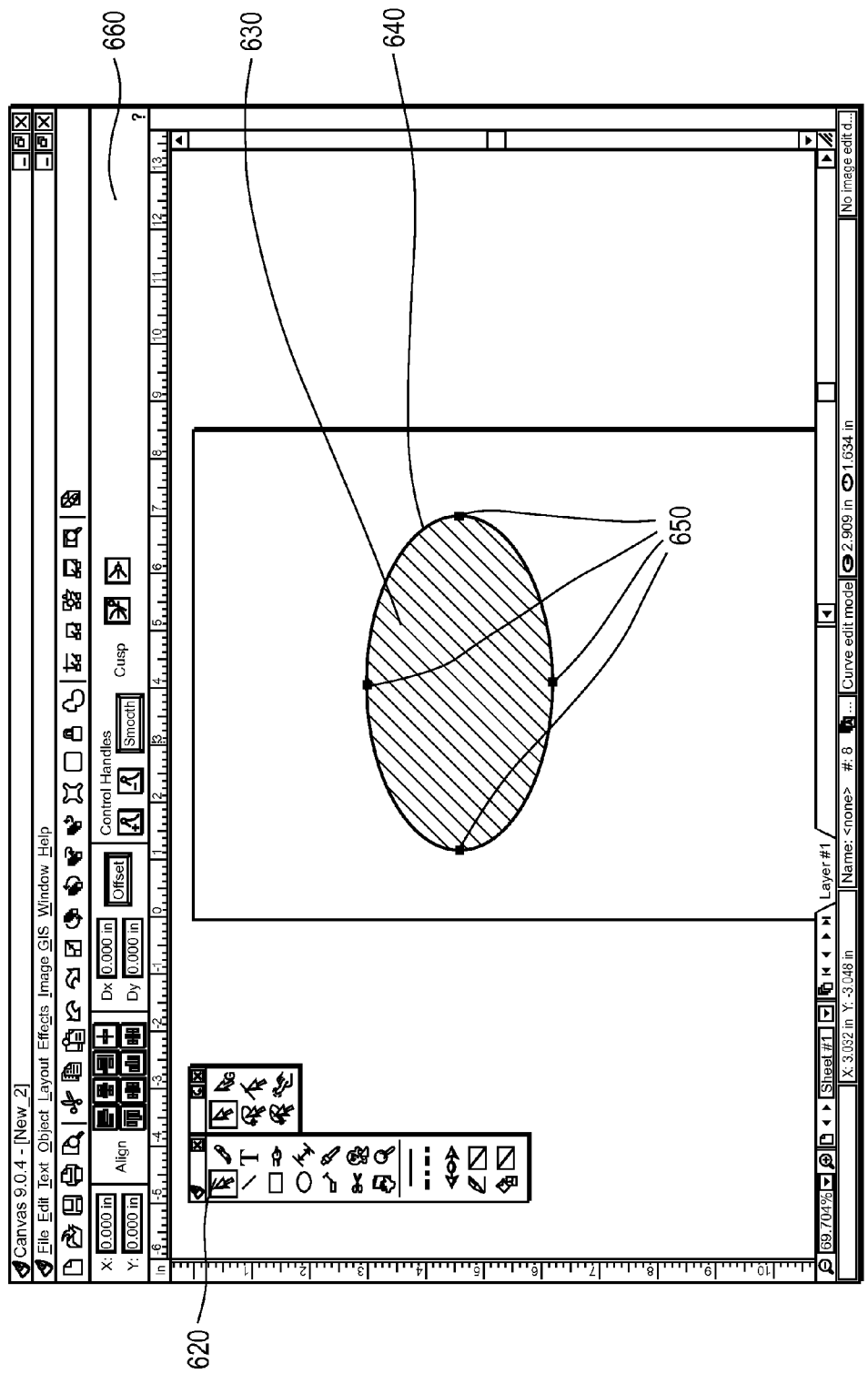

In FIG. 6B, the user has selected object 630 for editing, by double clicking on the object while the selection tool is active. Selection of vector object 630 is indicated by a frame 640 surrounding it, frame 640 having handles 650. In this current context, the user wishes to geometrically change object 630 and, accordingly, property bar 610 changes to property bar 660, which includes controls for changing the shape of object 630, such as handles and cusps.

Figure 6C:
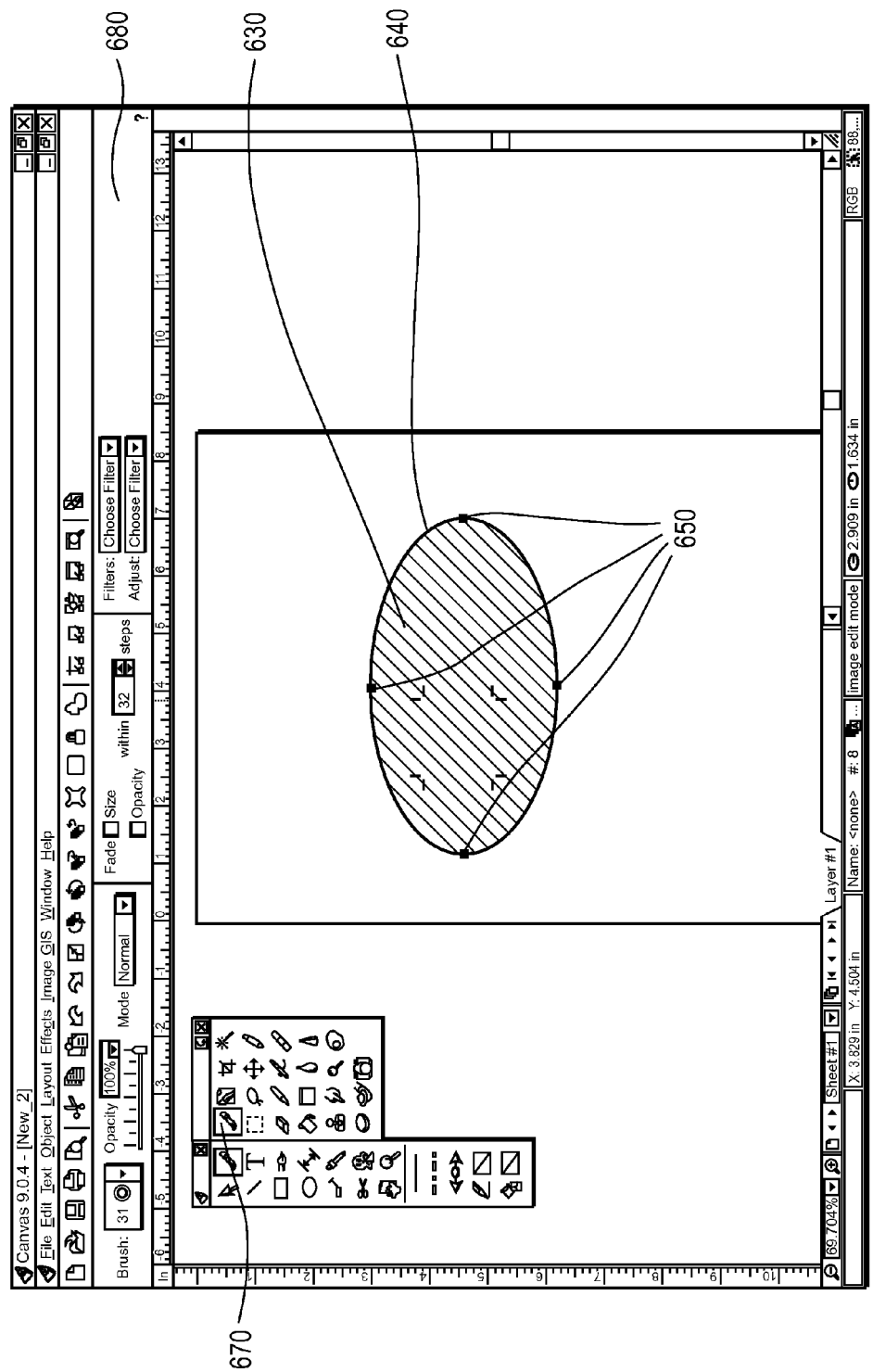

In FIG. 6C, the user has activated brush tool 670 for editing the selected object 630. Object 630 is still selected for editing, as evidenced by frame 640 surrounding it. In this context, the user wishes to edit object 630 by use of a paint brush and, accordingly, property bar 660 changes to property bar 680, which includes paint brush tools such as brush shape, brush thickness, brush mode and opacity.

Figure 6D:
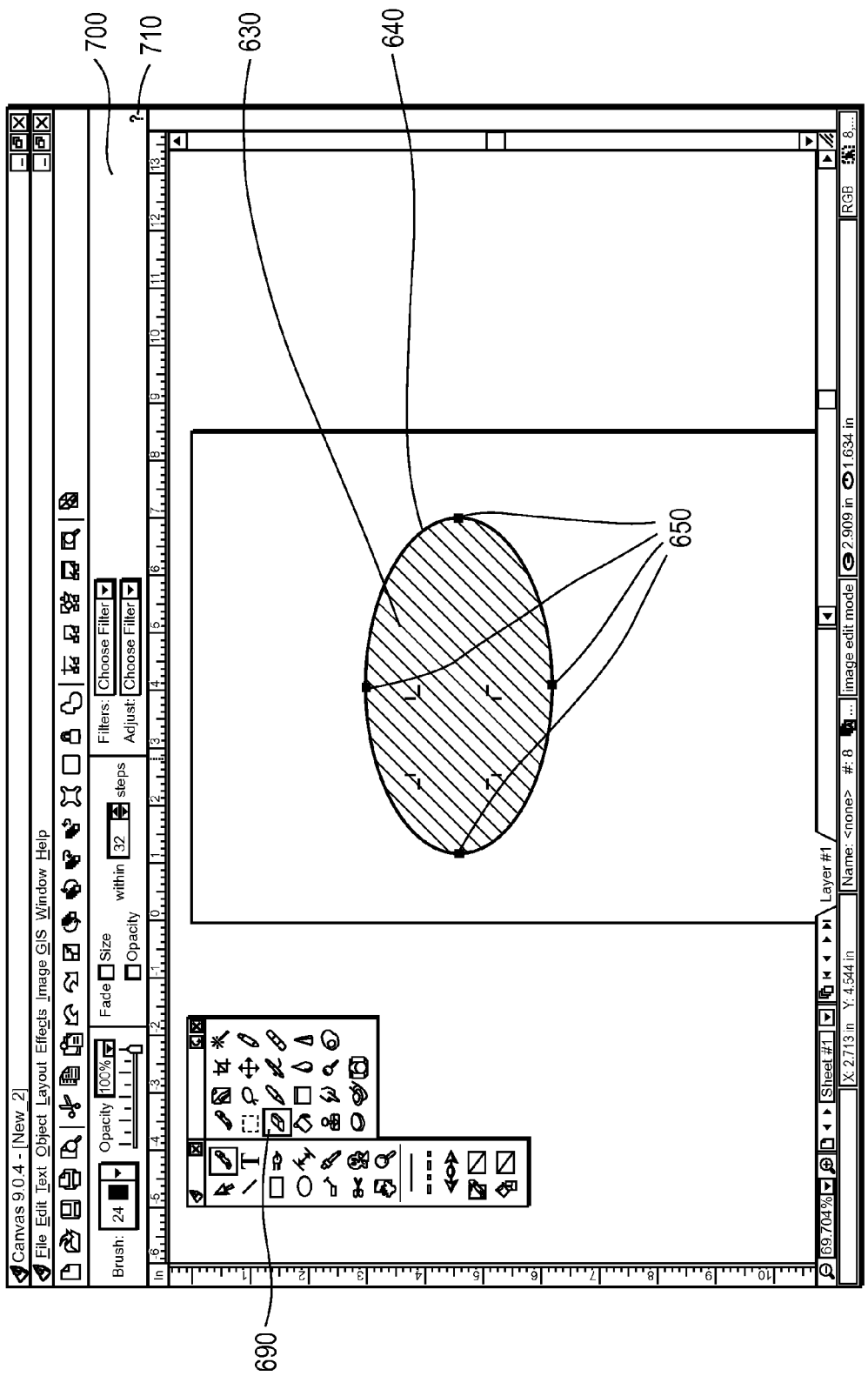

In FIG. 6D, the user has activated an eraser tool 690 for editing the selected object 630, instead of the previously selected brush tool 670. In this context, the user wishes to apply erasure strokes and, accordingly, property bar 680 further changes to property bar 700 which includes eraser tools such as eraser shape, eraser thickness and opacity. Observe that property bar 700 is different than property bar 680, since the brush mode control is not included in property bar 700.

Figure 6E:
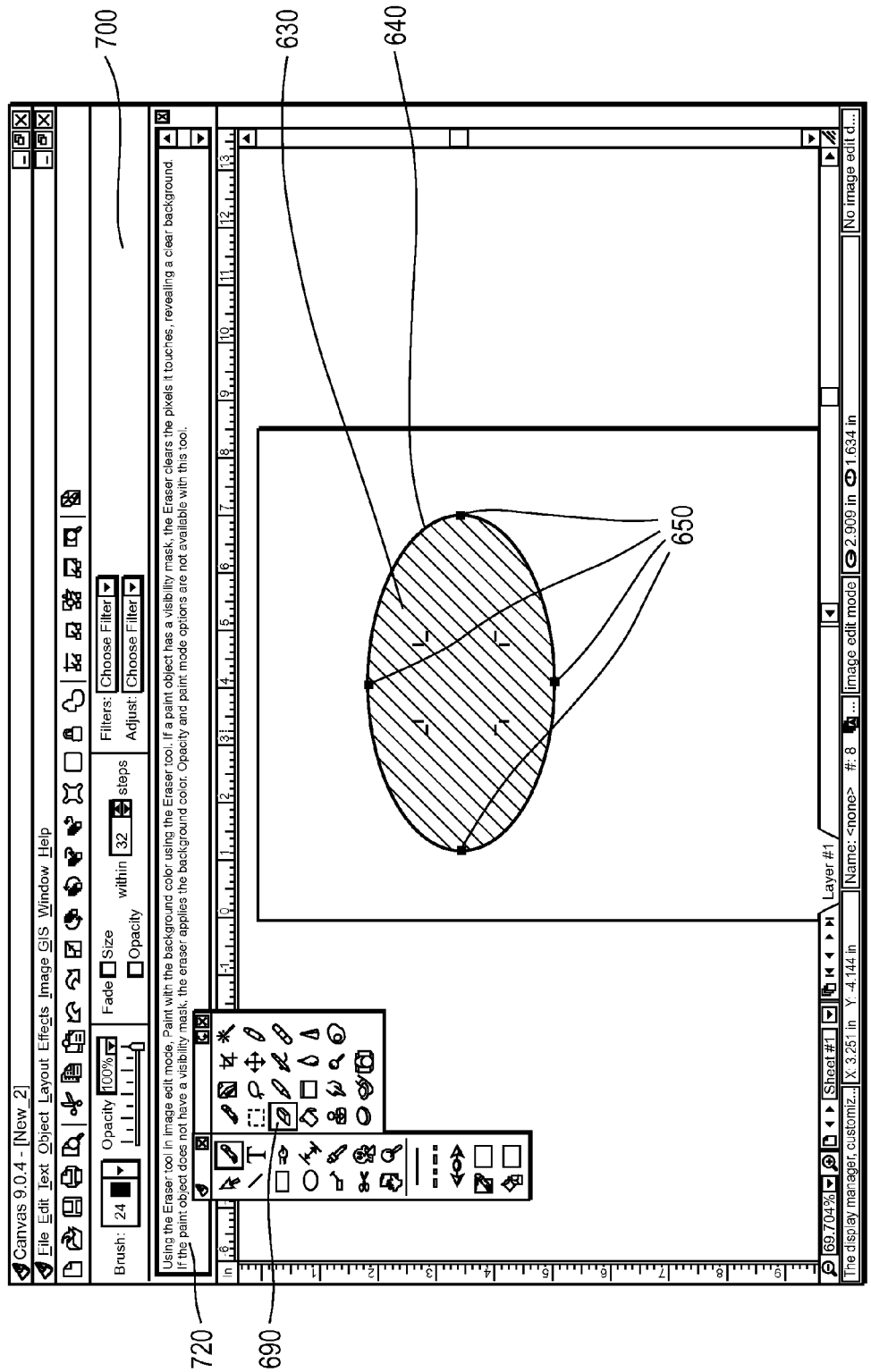

In accordance with a preferred embodiment of the present invention, property bars include a button 710 for context-sensitive help. When this button is pressed, instructions 720 specific to the current property bar are displayed, as shown in FIG. 6E.

Figure 6F:
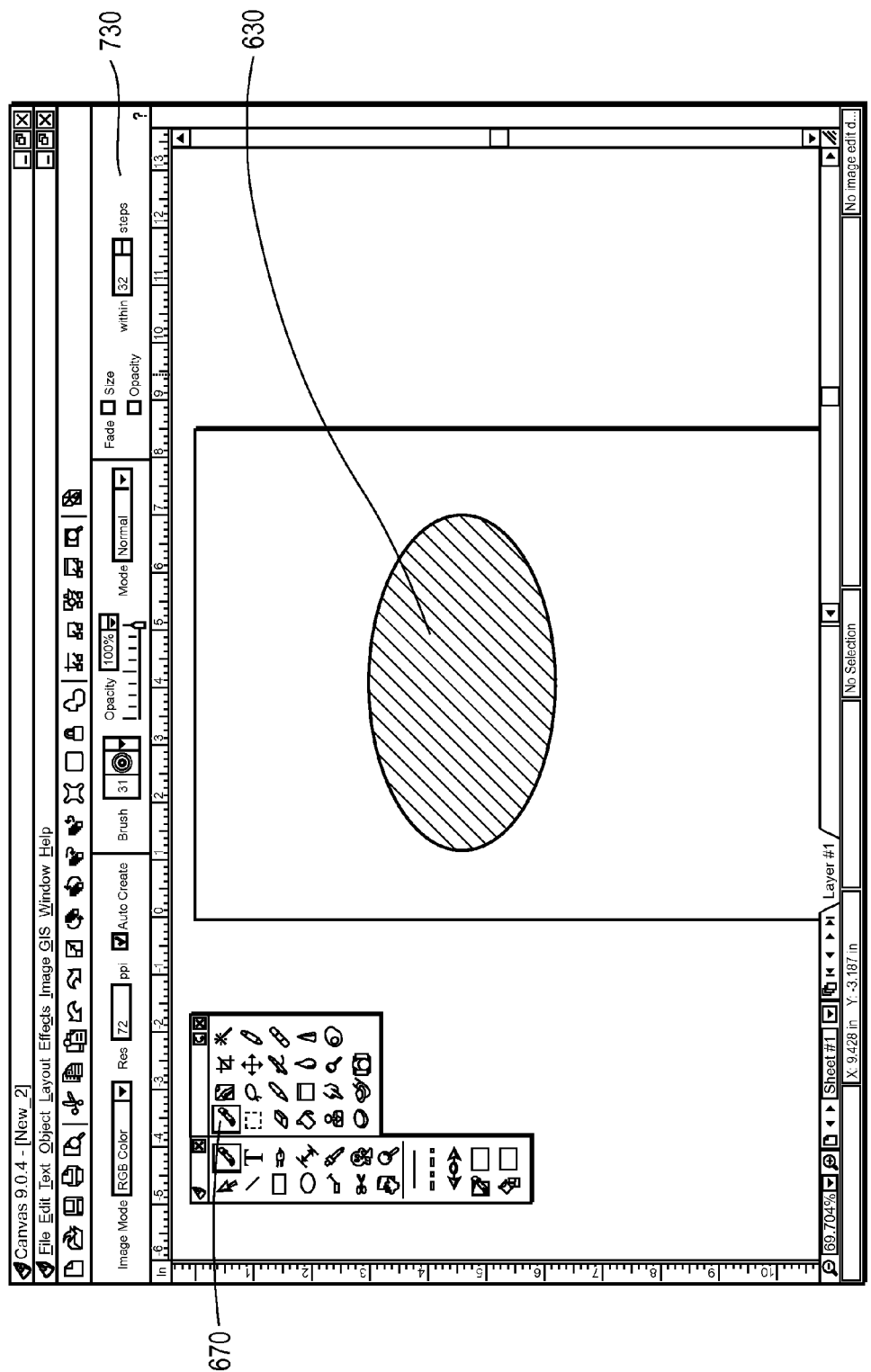

FIG. 6F shows property bar 730 corresponding to paint brush tool 670 being activated when object 630 is not selected. Although the same paint brush tool is activated in FIG. 6C and FIG. 6F, their contexts are different. Whereas FIG. 6C has an object selected in edit mode, FIG. 6F does not. It can be seen that property bar 730 is different than property bar 680, and includes an image mode control and does not include a filters control.

The following TABLE I summarizes the contexts of FIGS. 6A-6F and the contents of the corresponding property bars.

TABLE I

Context-Dependent Property Bars

| FIG. | Context | Contents of Property Bar |
|---|---|---|
| 6A | Selection tool activated Non-edit mode | Page size, units and drawing scale Grids, guides and rulers Layer selector |
| 6B | Selection tool activated Edit mode | Linear position Alignment Offset Handles and cusps |
| 6C | Paint brush tool activated Edit mode | Brush shape, opacity and mode Fade Filters |
| 6D, 6E | Erase tool activated Edit more | Brush shape, opacity Fade Filters |
| 6F | Paint brush tool activated Non-edit mode | Image mode and resolution Brush shape, opacity and mode Fade |

It may thus be appreciated that in accordance with a preferred embodiment of the present invention, a context is determined by an object, an edit mode and an activated tool. With each context is associated zero, one or more controls and, for each identified context, the property bar displays such associated controls.

Implementation Details

The present invention is preferably implemented through a data structure that keeps track of which window panels are fastened together as a union. As window panels become fastened together into unions, or separated from unions, the data structure is updated accordingly so as to reflect the current composition of unions of window panels.

Preferably, when a positioning operation is applied to a window panel, the same operation is applied simultaneously to all other window panels fastened together therewith. Thus, for example, if a window panel is moved 50 pixels to the right and 40 pixels downwards, then all other window panels fastened together with it are also simultaneously moved 50 pixels to the right and 40 pixels downwards. The effect of the simultaneous movement is to give an appearance that all of these window panels move cohesively together as a single area.

Reference is now made to Appendix A, which includes a detailed listing of computer source code written in the C++ programming language for managing window panels that can be fastened together in unions, in accordance with the present invention, and in conjunction with a Microsoft Windows operating system. As seen in Appendix A, a window panel is represented by a structure, WindowItemInfo, which includes a handle for the window panel and a Boolean flag indicating whether or not the window panel is snapped to another panel. A union of window panels is represented by a list, fwListPtr, of a number, fwCount, of windowItemInfo structures.

A list of all floating window panels is generated in a method CreateFloatWindowList( ), which steps through the panels using window handles provided by methods GetFirstFloatWindow( ) and GetNextFloatWindow( ). A list of window panels is sorted to arrange the window panels in the list from top-left of the display screen to bottom-right, using a method FWCompareProc( ) to compare two WindowItemInfo structures, and a method SortFloatWindowList( ) to apply a quicksort to the list relative to the order induced by FWCompareProc( ).

A method ArewindowRectsGlued( ) determines whether two window panels are fastened together adjacently. A recursive method TagAllWindowsForGluedWindowResize( ) steps through window panels using GetFirstFloatWindow( ) and GetNextFloatWindow( ) to identify window panels that are part of a union.

A method MoveFloatWindowAndGluedWindows( ) moves window panels that are part of a union by looping through a list fwListPtr[i] and moving all window panels that have a flag fwListPrt[1].flag set, indicating that such window panels are to be offset. The setting of the flags occurs in a method TagAllWindowsThatNeedOffset( ).

A method SnapFloatWindowRect( ) generates a union of areas by successive unions of rectangles, testRect.

It may be appreciated by those skilled in the art that the specific implementation described in Appendix A is but one of many alternative ways of programming the present invention.

Identification of child window panels and their locked or unlocked states is preferably implemented using a stack. The stack is popped when unlocked child panels are closed, and the stack is pushed when new child panels are opened.

Reference is now made to Appendix B, which includes a detailed listing of computer source code written in the C++ programming language for implementing a preferred embodiment for managing window panels that can have parent-child relationships, in accordance with the present invention, and in conjunction with a Microsoft Windows operating system. As seen in Appendix B, a toolbox palette is represented by a structure, PalData, and a stack of such palettes is represented by a linked list traversed by methods GetPrevWnd( ) and GetNextWnd( ). The locked or unlocked status of a child window panel is represented by the Boolean member is Locked of PalData.

It may be appreciated by those skilled in the art that the specific implementation described in Appendix B is but one of many alternative ways of programming the present invention.

Implementation of multi-page property bars, as shown in FIGS. 5A-5D, is preferably performed by determining a total screen width required to display all of the necessary controls, and allocating the controls to portions of the property bar, the width of each portion being determined by the width of the application window. For example, if 20 identically sized controls are to be displayed in a property bar, and if the width of the application window can only accommodate 6 such controls, then the property bar is rendered in 4 portions; namely, portion #1 with controls 1-6, portion #2 with controls 7-12, portion #3 with controls 13-18, and portion #4 with controls 19 and 20. Page forward and page backward buttons are preferably used to move from one portion of the property bar to the portion following or preceding it, respectively.

Implementation of context-dependent display bars is preferably performed by a modular software architecture, in which a master module is responsible for displaying a user interface including controls, and receiving events triggered when a user activates one of the displayed controls using a mouse or keyboard or combination of both. The master module's functionality includes:

identifying a current context based upon a tool activated by a user, an edit mode and an object;

identifying controls associated with the current context;

displaying a property bar including the associated controls, using page forward and page backwards buttons as necessary, if the associated controls cannot all fit together within the width of the application screen;

displaying an image being worked on, the image being a raster image or a vector image or a combined raster+vector image;

receiving messages from the operating system concerning user events, including inter alia mouse and keyboard events; and sending notification of the events to appropriate handlers for the controls.

Preferably, each of the available controls has an associated handler, which processes image data in response to user activation of a control.

Figure 7:
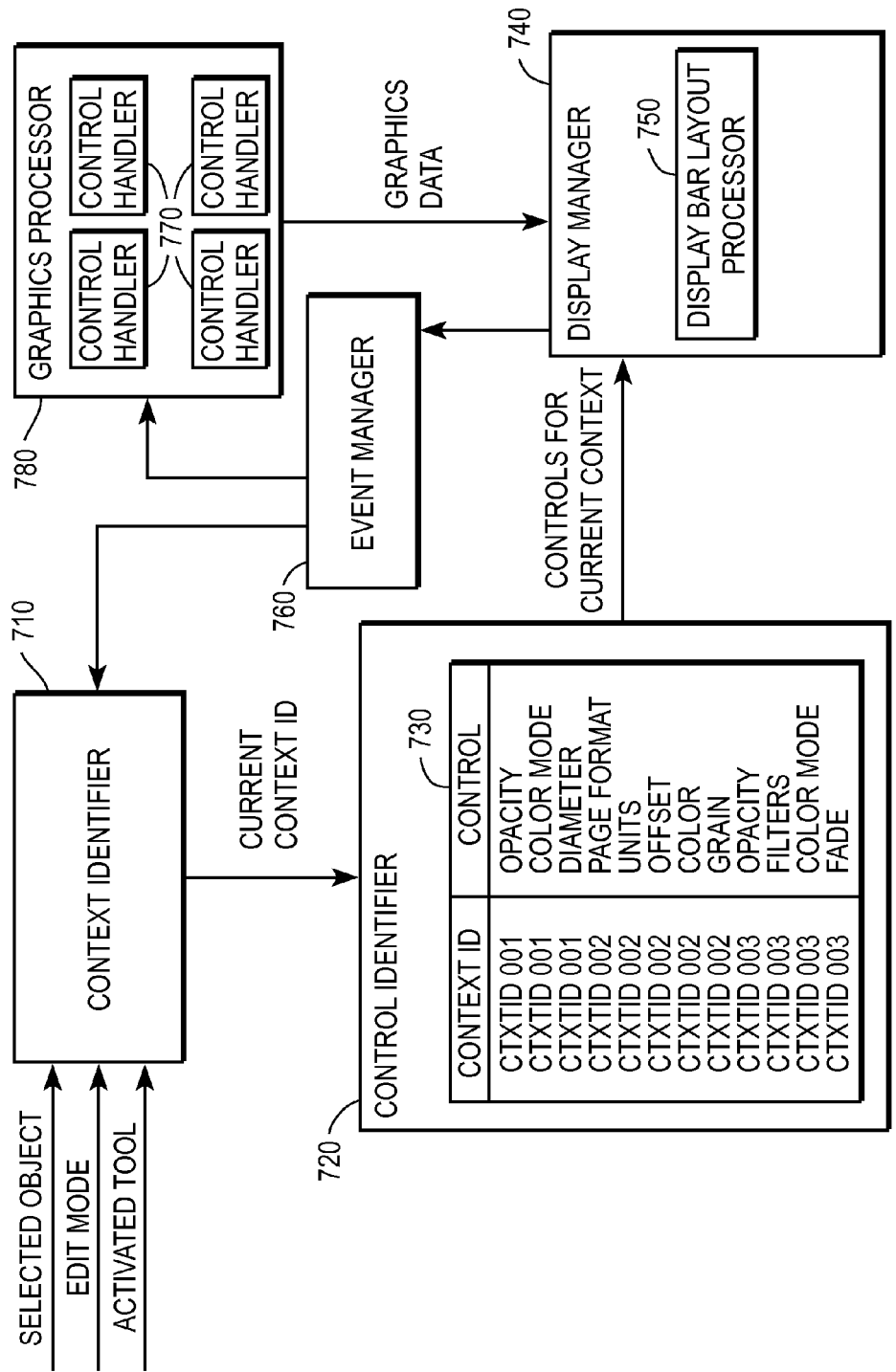
FIG. 7 is a simplified block diagram of a system for managing context-dependent property bars, in accordance with a preferred embodiment of the present invention.

Reference is now made to FIG. 7, which is a simplified block diagram of a system for managing context-dependent property bars in conjunction with a graphics software application, and in accordance with a preferred embodiment of the present invention. As shown in FIG. 7, a context identifier 710 receives a current state in which a user is working on a graphics object, the state including a currently selected object, a current edit mode and a currently activated tool, and determines a current context therefrom. Preferably, a unique ID is associated with each context.

A control identifier 720 receives the context ID from context identifier 710 and, preferably by accessing a look-up table 730 keyed on context IDs, determines a set of controls that are associated with the current context. The set of controls may be empty, or contain one or more controls. For example, look-up table 730 shows that a context ID CTX-TID 001 is associated with three controls; namely, an opacity control, a color mode control and a diameter control.

A display manager 740 receives the set of controls associated with the current context and displays them within a dynamically changing display bar, or property bar, as part of a graphical use interface. Display manager 740 includes a display bar layout processor 750, which preferably determines how the associated controls are to be displayed within the display bar. In particular, layout processor 750 may split the associated controls among portions of the display bar, in accordance with a preferred embodiment of the present invention as described above with reference to FIGS. 5A-5D. As a user pages back and forth through the portions of the display bar, different subsets of the associated controls become visible.

An event manager 760 listens for events intercepted by the operating system, such as user activation of a mouse or keyboard and combination thereof, while interacting with the graphical user interface. Specifically, event manager 760 detects when a control within the display bar is activated by a user.

Preferably, controls have handlers 770 associated therewith, which operate within an overall graphics processor 780. A handler generally processes a graphics object in a specific way, such as, for example, by modifying an edit path for a Bezier curve, or by adding paint brush strokes, or by modifying an opacity mask, or by filtering a raster image. When event manager 760 detects that a control is activated, it sends a notification to the control's handler 770, which then processes the graphics being worked on by the user accordingly. Preferably, event manager 760 also notifies context identifier 710 if the user changes the currently selected object, edit mode or tool, so that context identifier can change the current context accordingly.

Reference is now made to Appendix C, which includes a detailed listing of computer source code written in the C++ programming language for implementing a preferred embodiment for managing context-sensitive property bars and multi-page property bars, in accordance with the present invention, and in conjunction with a Microsoft Windows operating system. As seen in Appendix C, a context is modeled by a structure Cant exmode that includes three private members, pvDrawToolID, pvEditSessionType and pvObjType, respectively representing (i) a current draw tool activated by a user, (ii) a current edit session if the user is working in an edit mode, and (iii) a current object type if an object is currently selected. Contexts are associated with values of these three members. Thus, for example, a context may be associated with (i) a draw tool for circles, (ii) a Bezier edit session and (iii) a selected object type. These three members are accessed by public methods GetContextDrawTool( ), SetContextToDrawTool( ), GetContextEditSession( ), SetContextToEditSession( ), GetContextObjectType( ) and SetContextToObjectType( ). Contexts register themselves with control handlers by methods CXRegisterStandardContextItem( ) for standard handlers, and CXRegisterContextItem( ) for custom handlers.

It may be appreciated by those skilled in the art that the specific implementation described in Appendix C is but one of many alternative ways of programming the present invention.

In reading the above description, persons skilled in the art will realize that there are many apparent variations that can be applied to the methods and systems described. Thus, inter alia:

- although FIG. 3I illustrates window panels below and to the right of panel 350 being pulled away from a union, together with panel 350, other subsets of panels can be pulled away with panel 350 instead, such as panels above panel 350, or panels to the left of panel 350, or panels above and to the left of panel 350;
- child window panels can be fastened underneath or to the left of their parent window panels, instead of to the right of their window panels as illustrated in FIG. 4C; and
- buttons can be used to advance from one portion of a display bar directly to the last portion, or to go back directly to the first position, in addition to buttons 520 and 530 illustrated in FIG. 5C that move one portion at a time.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. A method for managing a context-dependent display bar, comprising:
   identifying a graphical object currently displayed by a graphics software application operated by a user;
   identifying a current edit mode in which the user is working, wherein the edit mode indicates whether or not the user has selected the identified graphical object for editing;
   identifying a tool for editing graphical objects currently activated by the user;
   determining a current context in which the user is working, the context depending upon the identified graphical object, the identified edit mode, and the identified tool;
   identifying a plurality of controls associated with the current context, wherein different contexts generally have at least one different control associated therewith; and
   displaying the plurality of controls associated with the current context within a display bar of the graphics software application, each time that the current context changes, comprising:
      splitting the plurality of controls associated with the current context into subsets; and
      inserting page forward and page backward controls into the display bar such that as a user pages back and forth through portions of the display bar using those page controls, different subsets of controls become visible.

2. The method of claim 1 wherein a control has a corresponding handler, and wherein the handler modifies a displayed graphical object.

3. The method of claim 2 further comprising:
   receiving notification of an event triggered by the user performing an input action on a selected one of the displayed controls; and
   notifying the handler of the selected control.

4. The method of claim 1 wherein a context has a unique identifier, and wherein said identifying at least one control comprises accessing a look-up table keyed on identifiers for contexts.

5. A processing system for managing a context-dependent display bar within a graphical user interface, comprising:
   a memory;
   a graphics processor coupled to the memory, the graphics processor comprising:
      a state identifier for identifying (i) a graphical object being displayed by a graphics software application operated by a user, (ii) an edit mode within which the user is working, wherein the edit mode indicates whether or not the user has selected the identified graphical object for editing, (iii) a tool for editing graphical objects activated by the user, and (iv) a plurality of controls associated with a current context in which a user is working; and
      a context identifier for determining the current context, the current context depending upon the identified graphical object, the identified edit mode, and the identified tool, and wherein different contexts generally have at least one different control associated therewith; and a display manager operatively coupled with said graphics processor for displaying a display bar including the plurality of controls associated with the current context, each time that the current context changes, comprising a display bar layout processor for splitting the plurality of controls associated with the current context into subsets, and for inserting page forward and page backward controls into the display bar such that as a user pages back and forth through portions of the display bar using those page controls, different subsets of controls become visible.

6. The processor of claim 5 wherein a control has a corresponding handler, and wherein the handler modifies a displayed graphical object.

7. The processor of claim 6 further comprising:
a message receiver for receiving notification of an event triggered by the user performing an input action on a selected one of the displayed controls; and
a message sender for notifying the handler of the selected control.

8. The processor of claim 5 wherein a context has a unique identifier, and wherein said state identifier accesses a look-up table keyed on identifiers for contexts.

9. A computer readable non-transitory storage medium storing program code for causing a computer to perform the steps of:

identifying a graphical object being displayed by a graphics software application operated by a user;
identifying an edit mode within which the user is working, wherein the edit mode indicates whether or not the user has selected the identified graphical object for editing;
identifying a tool for editing graphical objects activated by the user;
determining a context, the context depending upon the identified graphical object, the identified edit mode, and the identified tool;
identifying a plurality of controls associated with the context, wherein different contexts generally have at least one different control associated therewith; and
displaying the plurality of controls associated with the current context within a display bar of the graphics software application, each time that the context changes, comprising:
splitting the plurality of controls associated with the current context into subsets; and
inserting page forward and page backward controls into the display bar such that as a user pages back and forth through portions of the display bar using those page controls, different subsets of controls become visible.

* * * * *